United States Patent
Haruta et al.

(10) Patent No.: US 7,348,784 B2
(45) Date of Patent: Mar. 25, 2008

(54) ERROR FACTOR ACQUISITION DEVICE, METHOD, PROGRAM, AND RECORDING MEDIUM

(75) Inventors: Masato Haruta, Saitama (JP); Hiroyuki Sato, Gunma (JP); Takeshi Tanabe, Saitama (JP); Yoshikazu Nakayama, Saitama (JP)

(73) Assignee: ADVANTEST Corporation, Tokyo (JP)

( * ) Notice: Subject to any disclaimer, the term of this patent is extended or adjusted under 35 U.S.C. 154(b) by 0 days.

(21) Appl. No.: 10/572,381

(22) PCT Filed: Sep. 14, 2004

(86) PCT No.: PCT/JP2004/013713

§ 371 (c)(1),
(2), (4) Date: Oct. 19, 2006

(87) PCT Pub. No.: WO2005/029102

PCT Pub. Date: Mar. 31, 2005

(65) Prior Publication Data
US 2007/0029989 A1     Feb. 8, 2007

(30) Foreign Application Priority Data
Sep. 18, 2003  (JP) ............................. 2003-325793

(51) Int. Cl.
*G01R 35/00* (2006.01)
(52) U.S. Cl. .................... 324/601; 324/650; 324/76.22
(58) Field of Classification Search .............. 324/601, 324/650, 76.22
See application file for complete search history.

(56) References Cited

U.S. PATENT DOCUMENTS 6,853,198 B2 * 2/2005 Boudiaf et al. ............. 324/601

FOREIGN PATENT DOCUMENTS

| JP | 6-88844 | 3/1994 |
| JP | 10-197577 | 7/1998 |
| JP | 11-38054 | 2/1999 |

OTHER PUBLICATIONS

English language abstract of JP 11-38054, Feb. 12, 1999.
English language abstract of JP 10-197577, Jul. 31, 1998.
English language abstract of JP6-88844, Mar. 29, 1994.

* cited by examiner

*Primary Examiner*—Vincent Q. Nguyen
(74) *Attorney, Agent, or Firm*—Greenblum & Bernstein, P.L.C.

(57) ABSTRACT

A measurement system for circuit parameters of a device under test (DUT) that reduces the number of attachments and detachments of calibration kits. An error factor acquisition device includes a first calibrator connected to ports of a network analyzer that has a first state realization unit that determines open-circuit, short-circuit, and standard load states for the ports. Second calibrators connected to the first calibrator and the DUT have a second state realization unit that determines open-circuit, short-circuit, and standard load states for the ports. The first calibrator includes first connection units that connect the ports to the first state realization unit or to the respective second calibrators, while the second calibrators respectively include a second connection unit that connects the ports to the second state realization unit or the DUT.

16 Claims, 17 Drawing Sheets

(a)

(b)

(a)

(b)

ERROR FACTOR ACQUISITION DEVICE, METHOD, PROGRAM, AND RECORDING MEDIUM

TECHNICAL FIELD

The present invention relates to a measurement of error factors upon calculating and measuring circuit parameters of a device under test.

BACKGROUND ART

Conventionally, there have been measured circuit parameters (such as the S parameters) of a device under test (DUT) (refer to a patent document 1 (Japanese Laid-Open Patent Publication (Kokai) No. H11-38054, for example). A description will now be given of a measurement method of the circuit parameters of a device under test (DUT) according to the prior art with reference to FIG. 16.

A signal is transmitted from a signal source 130 to a reception unit 140 via a DUT 400. The signal is received by the reception unit 140. It is possible to acquire the S parameters and frequency characteristics of the DUT 400 by measuring the signal received by the reception unit 140.

On this occasion, measurement system errors are generated in the measurement due to mismatching between a measurement system such as the signal source 130 and the DUT 400, and the like. This measurement system errors include Ed: error caused by the direction of a bridge, Er: error caused by frequency tracking, and Es: error caused by source matching, for example. FIG. 17 shows a signal flow graph relating to the signal source 130. RF IN denotes a signal input from the signal source 130 to the DUT 400 and the like, S11m denotes an S parameter of the DUT 400 and the like acquired based upon a signal reflected from the DUT 400 and the like, and S11a denotes a true S parameter of the DUT 400 and the like without the measurement system errors.

On this occasion, it is possible to correct the errors according to the patent document 1, for example. The correction in this way is referred to as calibration. A brief description will now be given of the calibration. A calibration kit is connected to the signal source 130 to realize three types of states: open-circuit, short-circuit, and load (standard load Z0). In these states, a signal reflected from the calibration kit is acquired by a bridge to obtain three types of the S parameter (S11m) corresponding to the three types of states. The three types of variables Ed, Er, and Es are obtained from the three types of S parameter.

However, according to the above prior art, it is necessary to attach/detach three types of calibration kits: open-circuit, short-circuit, and load (standard load Z0), to/from the signal source 130. The number of operations of attachment/detachment is twice (attachment and detachment) for the one type of the calibration kit. As a result, the number of the operations to attach/detach the three types of the calibration kits is six. Upon the calibration, there poses a problem that the number of the attachments and detachments of the calibration kits increases, resulting in complicated operations.

In view of the foregoing problem, an object of the present invention is to calibrate the measurement system used for the circuit parameters of a device under test with a reduced number of the attachments/detachments of the calibration kits.

DISCLOSURE OF THE INVENTION

According to an aspect of the present invention, an error factor acquisition device that acquires an error factor between a device under test and a network analyzer having a signal output unit, an output port that outputs a signal supplied from the signal output unit, and a reception port that receives the signal, includes: a first calibration unit that includes a first state realization unit that realizes a first state for the output port and the reception port of the network analyzer, and is connected to the output port and the reception port; and a second calibration unit that includes a second state realization unit that realizes a second state for the output port and the reception port of the network analyzer, and is connected to the first calibration unit and the device under test, wherein: the first calibration unit includes a first connection unit that connects the output port and the reception port either to the first state realization unit or the second calibration unit; and the second calibration unit includes a second connection unit that connects the output port and the reception port either to the second state realization unit or the device under test.

According to the thus constructed invention, an error factor acquisition device that acquires an error factor between a device under test and a network analyzer is provided. The network analyzer has a signal output unit, an output port that outputs a signal supplied from the signal output unit, and a reception port that receives the signal. The error factor acquisition device includes a first calibration unit and a second calibration unit. The first calibration unit includes a first state realization unit that realizes a first state for the output port and the reception port of the network analyzer, and is connected to the output port and the reception port. The second calibration unit includes a second state realization unit that realizes a second state for the output port and the reception port of the network analyzer, and is connected to the first calibration unit and the device under test. The first calibration unit includes a first connection unit that connects the output port and the reception port either to the first state realization unit or the second calibration unit. The second calibration unit includes a second connection unit that connects the output port and the reception port either to the second state realization unit or the device under test.

According to the error factor acquisition device of the present invention, the first state realization unit may include: an open-circuit calibration tool that realizes an open-circuit state; a short-circuit calibration tool that realizes a short-circuit state; a standard load calibration tool that realizes a standard load state; a short-circuiting unit that short-circuits the output port and the reception port; an output port connection unit that connects any one of the open-circuit calibration tool, the short-circuit calibration tool, the standard load calibration tool, and the short-circuiting unit to the output port; and a reception port connection unit that connects any one of the open-circuit calibration tool, the short-circuit calibration tool, the standard load calibration tool, and the short-circuiting unit to the reception port.

According to the error factor acquisition device of the present invention, the second state realization unit may include: an open-circuit calibration tool that realizes an open-circuit state; a short-circuit calibration tool that realizes a short-circuit state; a standard load calibration tool that realizes a standard load state; and a calibration tool connection unit that connects any one of the open-circuit calibration tool, the short-circuit calibration tool, and the standard load calibration tool to the network analyzer.

According to the error factor acquisition device of the present invention, the number of ports of the device under test may be larger than the number of ports of the network analyzer, and the error factor acquisition device may include a branch connection unit that connects a port of the first calibration unit to any one of ports of the second calibration unit.

According to the error factor acquisition device of the present invention, the device under test may include a wafer and a wafer probe that is in contact with the wafer, and may be connected to the second calibration unit.

Another aspect of the present invention is an error factor acquisition method for acquiring an error factor by using an error factor acquisition device that acquires an error factor between a device under test and a network analyzer having a signal output unit, an output port that outputs a signal supplied from the signal output unit, and a reception port that receives the signal, including: (i) a first calibration unit that includes a first state realization unit that realizes a first state for the output port and the reception port of the network analyzer, and is connected to the output port and the reception port; and (ii) a second calibration unit that includes a second state realization unit that realizes a second state for the output port and the reception port of the network analyzer, and is connected to the first calibration unit and the device under test, wherein: (iii) the first calibration unit includes a first connection unit that connects the output port and the reception port either to the first state realization unit or the second calibration unit; and (iv) the second calibration unit includes a second connection unit that connects the output port and the reception port either to the second state realization unit or the device under test, the error factor acquisition method including: a first error factor acquisition step of acquiring a first error factor between the network analyzer and the first calibration unit based upon predetermined parameters measured for a signal before being output from the output port, a signal reflected back from the first state realization unit to the output port, and a signal received by the reception port upon the network analyzer being connected to the first state realization unit; and a second error factor acquisition step of acquiring a second error factor between the device under test and the first calibration unit based upon a signal before being output from the output port, and a signal reflected back from the second state realization unit to the output port upon the network analyzer being connected to the second state realization unit.

Another aspect of the present invention is an error factor acquisition method for acquiring an error factor by using an error factor acquisition device that acquires an error factor between a device under test and a network analyzer having a signal output unit, an output port that outputs a signal supplied from the signal output unit, and a reception port that receives the signal, including: (i) a first calibration unit that includes a first state realization unit that realizes a first state for the output port and the reception port of the network analyzer, and is connected to the output port and the reception port; and (ii) a second calibration unit that includes a second state realization unit that realizes a second state for the output port and the reception port of the network analyzer, and is connected to the first calibration unit and the device under test, wherein: (iii) the first calibration unit includes a first connection unit that connects the output port and the reception port either to the first state realization unit or the second calibration unit; (iv) the second calibration unit includes a second connection unit that connects the output port and the reception port either to the second state realization unit or the device under test; and (v) the device under test includes a wafer and a wafer probe that is in contact with the wafer, and is connected to the second calibration unit, the error factor acquisition method including: a first error factor acquisition step of acquiring a first error factor between the network analyzer and the first calibration unit based upon predetermined parameters measured for a signal before being output from the output port, a signal reflected back from the first state realization unit to the output port, and a signal received by the reception port upon the network analyzer being connected to the first state realization unit; a second error factor acquisition step of acquiring a second error factor between the device under test and the first calibration unit based upon a signal before being output from the output port, and a signal reflected back from the second state realization unit to the output port upon the network analyzer being connected to the second state realization unit; and a wafer measurement step of measuring a predetermined parameter of the wafer based upon the first error factor, the second error factor, and an error factor of the wafer probe.

Another aspect of the present invention is a program of instructions for execution by the computer to perform an error factor acquisition process for acquiring an error factor by using an error factor acquisition device that acquires an error factor between a device under test and a network analyzer having a signal output unit, an output port that outputs a signal supplied from the signal output unit, and a reception port that receives the signal, including: (i) a first calibration unit that includes a first state realization unit that realizes a first state for the output port and the reception port of the network analyzer, and is connected to the output port and the reception port; and (ii) a second calibration unit that includes a second state realization unit that realizes a second state for the output port and the reception port of the network analyzer, and is connected to the first calibration unit and the device under test, wherein: (iii) the first calibration unit includes a first connection unit that connects the output port and the reception port either to the first state realization unit or the second calibration unit; and (iv) the second calibration unit includes a second connection unit that connects the output port and the reception port either to the second state realization unit or the device under test, the error factor acquisition process including: a first error factor acquisition step of acquiring a first error factor between the network analyzer and the first calibration unit based upon predetermined parameters measured for a signal before being output from the output port, a signal reflected back from the first state realization unit to the output port, and a signal received by the reception port upon the network analyzer being connected to the first state realization unit; and a second error factor acquisition step of acquiring a second error factor between the device under test and the first calibration unit based upon a signal before being output from the output port, and a signal reflected back from the second state realization unit to the output port upon the network analyzer being connected to the second state realization unit.

Another aspect of the present invention is a program of instructions for execution by the computer to perform an error factor acquisition process for acquiring an error factor by using an error factor acquisition device that acquires an error factor between a device under test and a network analyzer having a signal output unit, an output port that outputs a signal supplied from the signal output unit, and a reception port that receives the signal, including: (i) a first calibration unit that includes a first state realization unit that realizes a first state for the output port and the reception port of the network analyzer, and is connected to the output port and the reception port; and (ii) a second calibration unit that includes a second state realization unit that realizes a second state for the output port and the reception port of the network analyzer, and is connected to the first calibration unit and the device under test, wherein: (iii) the first calibration unit includes a first connection unit that connects the output port and the reception port either to the first state realization unit or the second calibration unit; (iv) the second calibration unit includes a second connection unit that connects the output port and the reception port either to the second state realization unit or the device under test; and (v) the device under test includes a wafer and a wafer probe that is in contact with the wafer, and is connected to the second calibration unit, the error factor acquisition process including: a first error factor acquisition step of acquiring a first error factor between the network analyzer and the first calibration unit based upon predetermined parameters measured for a signal before being output from the output port, a signal reflected back from the first state realization unit to the output port, and a signal received by the reception port upon the network analyzer being connected to the first state realization unit; a second error factor acquisition step of acquiring a second error factor between the device under test and the first calibration unit based upon a signal before being output from the output port, and a signal reflected back from the second state realization unit to the output port upon the network analyzer being connected to the second state realization unit; and a wafer measurement step of measuring a predetermined parameter of the wafer based upon the first error factor, the second error factor, and an error factor of the wafer probe.

Another aspect of the present invention is a computer-readable medium having a program of instructions for execution by the computer to perform an error factor acquisition process for acquiring an error factor by using an error factor acquisition device that acquires an error factor between a device under test and a network analyzer having a signal output unit, an output port that outputs a signal supplied from the signal output unit, and a reception port that receives the signal, including: (i) a first calibration unit that includes a first state realization unit that realizes a first state for the output port and the reception port of the network analyzer, and is connected to the output port and the reception port; and (ii) a second calibration unit that includes a second state realization unit that realizes a second state for the output port and the reception port of the network analyzer, and is connected to the first calibration unit and the device under test, wherein: (iii) the first calibration unit includes a first connection unit that connects the output port and the reception port either to the first state realization unit or the second calibration unit; and (iv) the second calibration unit includes a second connection unit that connects the output port and the reception port either to the second state realization unit or the device under test, the error factor acquisition process including: a first error factor acquisition step of acquiring a first error factor between the network analyzer and the first calibration unit based upon predetermined parameters measured for a signal before being output from the output port, a signal reflected back from the first state realization unit to the output port, and a signal received by the reception port upon the network analyzer being connected to the first state realization unit; and a second error factor acquisition step of acquiring a second error factor between the device under test and the first calibration unit based upon a signal before being output from the output port, and a signal reflected back from the second state realization unit to the output port upon the network analyzer being connected to the second state realization unit.

Another aspect of the present invention is a computer-readable medium having a program of instructions for execution by the computer to perform an error factor acquisition process for acquiring an error factor by using an error factor acquisition device that acquires an error factor between a device under test and a network analyzer having a signal output unit, an output port that outputs a signal supplied from the signal output unit, and a reception port that receives the signal, including: (i) a first calibration unit that includes a first state realization unit that realizes a first state for the output port and the reception port of the network analyzer, and is connected to the output port and the reception port; and (ii) a second calibration unit that includes a second state realization unit that realizes a second state for the output port and the reception port of the network analyzer, and is connected to the first calibration unit and the device under test, wherein: (iii) the first calibration unit includes a first connection unit that connects the output port and the reception port either to the first state realization unit or the second calibration unit; (iv) the second calibration unit includes a second connection unit that connects the output port and the reception port either to the second state realization unit or the device under test; and (v) the device under test includes a wafer and a wafer probe that is in contact with the wafer, and is connected to the second calibration unit, the error factor acquisition process including: a first error factor acquisition step of acquiring a first error factor between the network analyzer and the first calibration unit based upon predetermined parameters measured for a signal before being output from the output port, a signal reflected back from the first state realization unit to the output port, and a signal received by the reception port upon the network analyzer being connected to the first state realization unit; a second error factor acquisition step of acquiring a second error factor between the device under test and the first calibration unit based upon a signal before being output from the output port, and a signal reflected back from the second state realization unit to the output port upon the network analyzer being connected to the second state realization unit; and a wafer measurement step of measuring a predetermined parameter of the wafer based upon the first error factor, the second error factor, and an error factor of the wafer probe.

BRIEF DESCRIPTION OF THE DRAWINGS

FIG. 5 shows signal flow graphs when the first connection unit 110a (110b) connects the port 18 (28) to the second calibrator 200, and the second connection units 210 connect the ports 202 to the DUT 400, wherein FIG. 5(a) is a signal flow graph if the port 18 is the output port, and the port 28 is the reception port, and FIG. 5(b) is a signal flow graph if the port 18 is the reception port, and the port 28 is the output port;

FIG. 15 shows signal flow graphs when the first connection unit 110a (110b) connects the port 18 (28) to the second calibrators 200, and the second connection units 210 connect the ports 202 to the wafer probes 420, wherein FIG. 15(a) is a signal flow graph if the port 18 is the output port, and the port 28 is the reception port, and FIG. 15(b) is a signal flow graph if the port 18 is the reception port, and the port 28 is the output port;

BEST MODE FOR CARRYING OUT THE INVENTION

A description will now be given of embodiments of the present invention with reference to drawings.

First Embodiment

Figure 1:
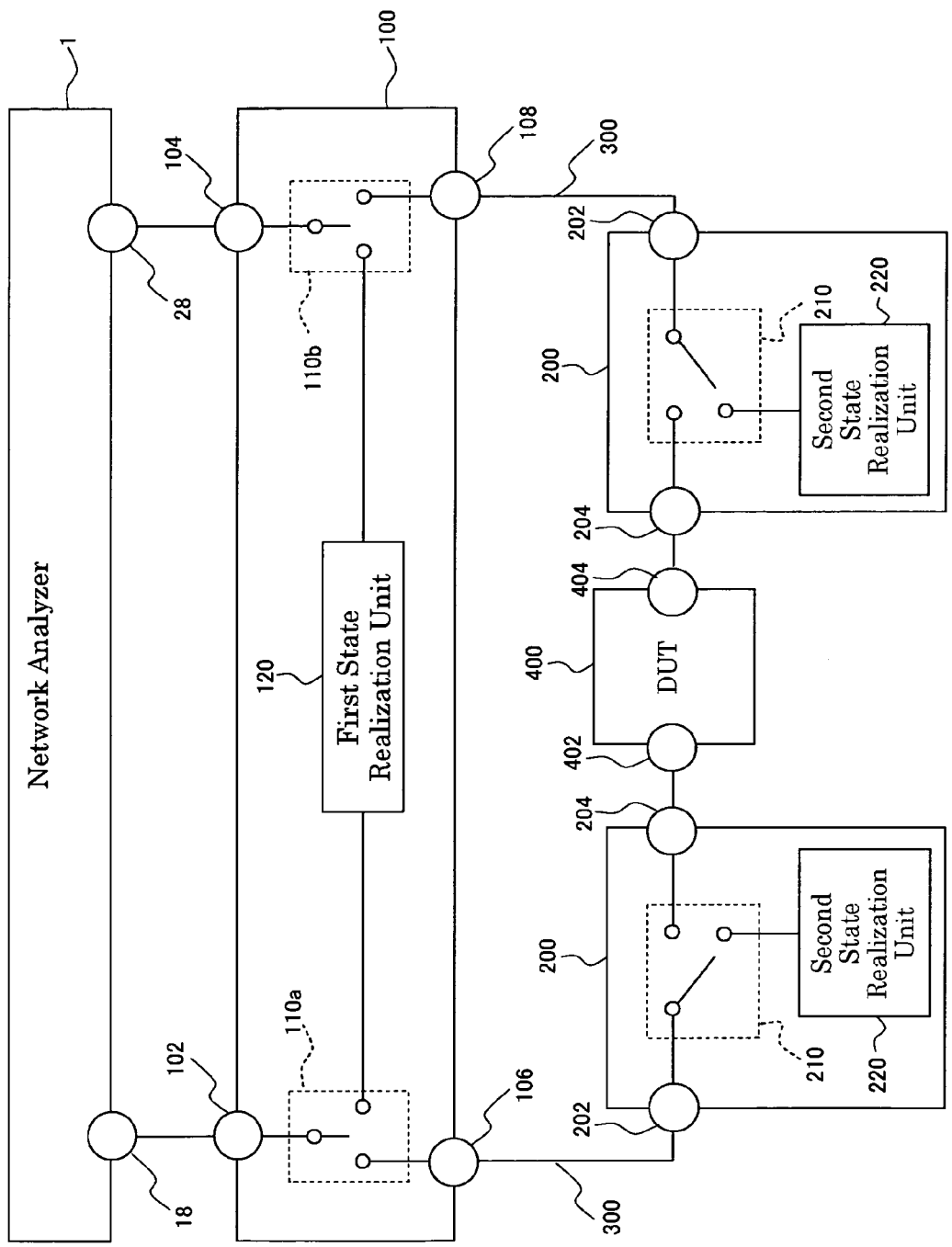
FIG. 1 is a diagram showing a configuration of a measurement system in which an error factor acquisition device according to a first embodiment of the present invention is used.

FIG. 1 is a diagram showing a configuration of a measurement system in which an error factor acquisition device according to a first embodiment of the present invention is used. The measurement system is provided with a network analyzer 1, a first calibrator 100, second calibrators 200, cables 300, and a DUT 400. The first calibrator 100 and the second calibrators 200 constitute the error factor acquisition device.

Figure 2:
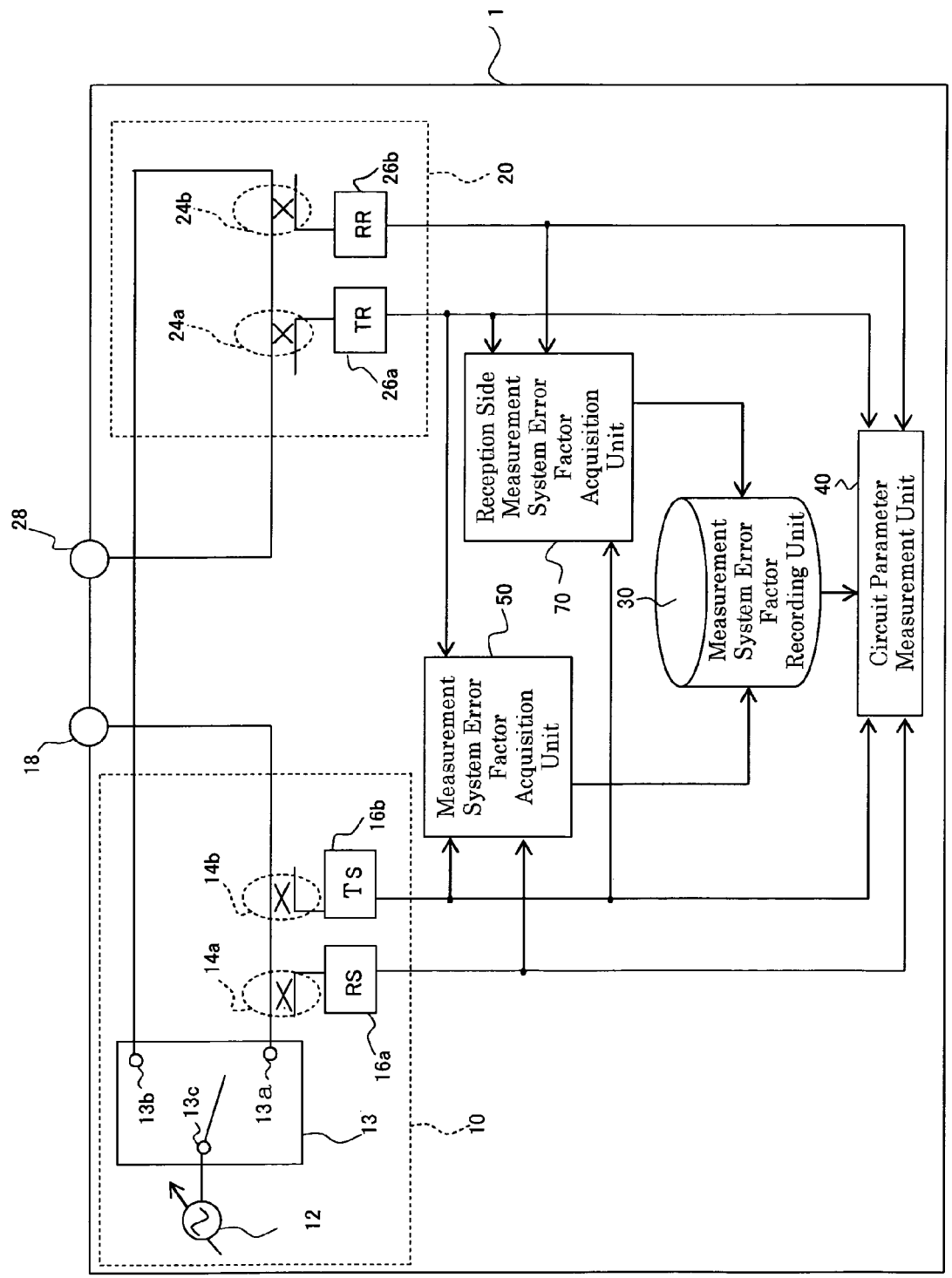
FIG. 2 is a diagram showing a configuration of the network analyzer 1.

FIG. 2 shows a configuration of the network analyzer 1. The network analyzer 1 is provided with a signal source 10, a reception means 20, a measurement system error factor recording unit 30, a circuit parameter measurement unit 40, a measurement system error factor acquisition unit 50, a reception side measurement system error factor recording unit 70.

The signal source 10 is provided with a signal output unit 12, a switch 13, bridges 14a and 14b, a receiver (RS) 16a, a receiver (TS) 16b, and a port 18.

The signal output unit 12 outputs an input signal with a predetermined frequency. It should be noted that the predetermined frequency is variable.

The switch 13 is a switch used to select whether the input signal output from the signal output unit 12 is output from a port 18 or a port 28. The switch 13 includes terminals 13a, 13b, and 13c. The terminal 13a is connected to the port 18, the terminal 13b is connected to the reception means 20, and the terminal 13c is connected to the signal output unit 12. If the terminal 13a and the terminal 13c are connected, namely the switch 13 is switched to a side of the terminal 13a, the input signal is output from the port 18. If the terminal 13a and the terminal 13b are connected, namely the switch 13 is switched to a side of the terminal 13b, the input signal is output from the port 28.

If the input signal is output from the port 28, a signal from the port 18 is to be input to the signal source 10. On this occasion, the bridge 14b supplies the receiver (TS) 16b with the signal.

The bridge 14a supplies the receiver (RS) 16a with the signal output from the signal output unit 12. The bridge 14b supplies the receiver (TS) 16b with a reflected signal which is the input signal output from the port 18, and is then reflected back. It should be noted that the bridges 14a and 14b may be power splitters. Other bridges described later may be substituted by power splitters.

The receiver (RS) 16a measures S parameters of the signal received via the bridge 14a. The receiver (TS) 16b measures S parameters of the signal received via the bridge 14b.

The port 18 serves as a terminal to output the input signal.

The reception means 20 includes bridges 24a and 24b, a receiver (TR) 26a, a receiver (RR) 26b, and the port 28.

If the input signal is output from the port 18, the bridge 24a supplies the receiver (TR) 26a with a signal input from the port 28. The receiver (TR) 26a measures S parameters of the received signal. The port 28 serves as a terminal used for the reception means 20 to receive a signal.

If the switch 13 is switched to the side of the terminal 13b, the input signal output by the signal output unit 12 is transmitted to the reception means 20 via the switch 13. The bridge 24b supplies the receiver (RR) 26b with the input signal. The bridge 24a supplies the receiver (TR) 26a with a reflected signal which is the input signal output from the port 28, and is then reflected back.

If the input signal is output from the port (output port) 18, the port (reception port) 28 receives the signal via the DUT 400. If the input signal is output from the port (output port) 28, the port (reception port) 18 receives the signal via the DUT 400.

The receiver (TR) 26a measures the S parameters of the signal received via the bridge 24a. The receiver (RR) 26b measures the S parameters of the input signal received via the bridge 24b.

The measurement system error factor recording unit 30 records error factors of the measurement system of the network analyzer 1. The error factors of the measurement system include first error factors and second error factors. The first error factors are error factors between the network analyzer 1 and the first calibrator 100. The second error factors are error factors between the DUT 400 and the first calibrator 100. The second error factors are error factors caused mainly by the cables 300.

The circuit parameter measuring unit 40 measures true S parameters (without influences of the measurement system error factors) of the DUT 400 based upon:

(1) data (S parameters) relating to the DUT 400 measured by the receiver (RS) 16a, the receiver (TS) 16b, and the receiver (TR) 26a if the input signal is output from the port 18, (2) data (S parameters) relating to the DUT 400 measured by the receiver (RR) 26b, the receiver (TR) 26a, and the receiver (TS) 16b if the input signal is output from the port 28, and (3) the measurement system error factors recorded by the measurement system error factor recording unit 30.

The measurement system error factor acquisition unit 50 acquires the error factors of the measurement system based upon the measurement results by the receiver (RS) 16a, the receiver (TS) 16b, and the receiver (TR) 26a.

The reception side measurement system error factor acquisition unit 70 acquires the error factors of the measurement system based upon the measurement results by the receiver (RR) 26b, the receiver (TR) 26a, and the receiver (TS) 16b.

The first calibrator 100 includes ports 102, 104, 106, and 108, first connection units 110a and 110b, and a first state realization unit 120.

The port 102 is connected to the port 18. The port 104 is connected to the port 28. The port 106 is connected to a port 202 of the second calibrator 200. The port 108 is connected to a port 202 of the second calibrator 200.

The first connection unit 110a is connected to the ports 102, 106, and the first state realization unit 120. The first connection unit 110a connects the port 102 to the port 106 or the first state realization unit 120. The first connection unit 110a thus connects the port 18 to the second calibrator 200 or the first state realization unit 120. It should be noted that the port 18 serves as an output port (if a signal is output from the port 18) or a reception port (if a signal is output from the port 28).

The first connection unit 110b is connected to the ports 104 and 108, and the first state realization unit 120. The first connection unit 110b connects the port. 104 to the port 108 or the first state realization unit 120. The first connection unit 110b thus connects the port 28 to the second calibrator 200 or the first state realization unit 120. It should be noted that the port 28 serves as a reception port (if a signal is output from the port 18) or an output port (if a signal is output from the port 28).

Figure 3:
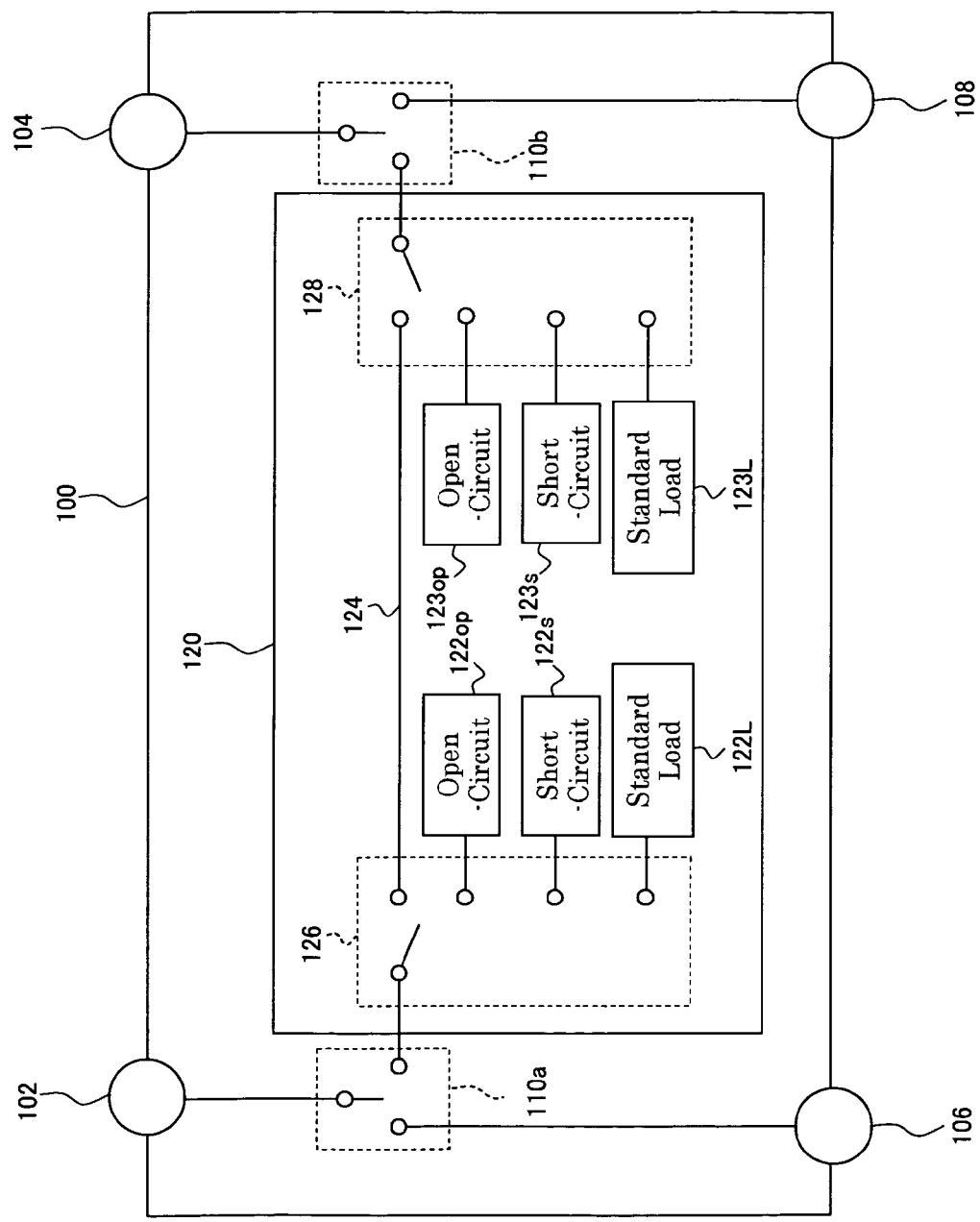
FIG. 3 is a diagram showing a configuration of a first state realization unit 120.

The first state realization unit 120 realizes a fist state for the ports 18 and 28, namely for the output port and the reception port. A configuration of the first state realization unit 120 is shown in FIG. 3. The first state realization unit 120 includes open-circuit calibration tools 122op and 123op, short-circuit calibration tools 122s and 123s, standard load calibration tools 122L and 123L, a short circuit unit 124, and port connection units 126 and 128.

The calibration tools are well-known calibration tools which realize three types of state: open-circuit, short-circuit, and load (standard load Z0) as described in Japanese Laid-Open Patent Publication (Kokai) No. H11-38054.

The open-circuit calibration tool 122op realizes the open-circuit state for the port 18. The open-circuit calibration tool 123op realizes the open-circuit state for the port 28. The short-circuit calibration tool 122s realizes the short-circuit state for the port 18. The short-circuit calibration tool 123s realizes the short-circuit state for the port 28. The standard load calibration tool 122L realizes the standard load state for the port 18. The standard load calibration tool 123L realizes the standard load state for the port 28.

The short circuit unit 124 is used to connect the port 18 and the port 28 with each other.

Namely, the first state includes the open-circuit state, the short-circuit state, and the standard load state for the port 18, the open-circuit state, the short-circuit state, and the standard load state for the port 28, and the state to connect the port 18 and the port 28 with each other.

The port connection unit 126 connects any one of the open-circuit calibration tool 122op, the short-circuit calibration tool 122s, the standard load calibration tool 122L, and the short circuit unit 124 to the first connection unit 110a. The port connection unit 126 is a type of a switch.

The port connection unit 128 connects any one of the open-circuit calibration tool 123op, the short-circuit calibration tool 123s, the standard load calibration tool 123L, and the short circuit unit 124 to the first connection unit 110b. The port connection unit 128 is a type of a switch.

The second calibrator 200 includes ports 202 and 204, a second connection unit 210, and a second state realization unit 220.

The port 202 is connected to the port 106 (108). The port 204 is connected to a port 402 of the DUT 400.

The second connection unit 210 is connected to the ports 202 and 204, and the second state realization unit 220. The second connection unit 210 connects the port 202 to the port 204 or the second state realization unit 220.

As a result, if the port 202 is connected to the port 18 (28) via the first connection unit 110a (110b), the second connection unit 210 connects the port 18 (28) to the DUT 400 or the second state realization unit 220.

Figure 4:
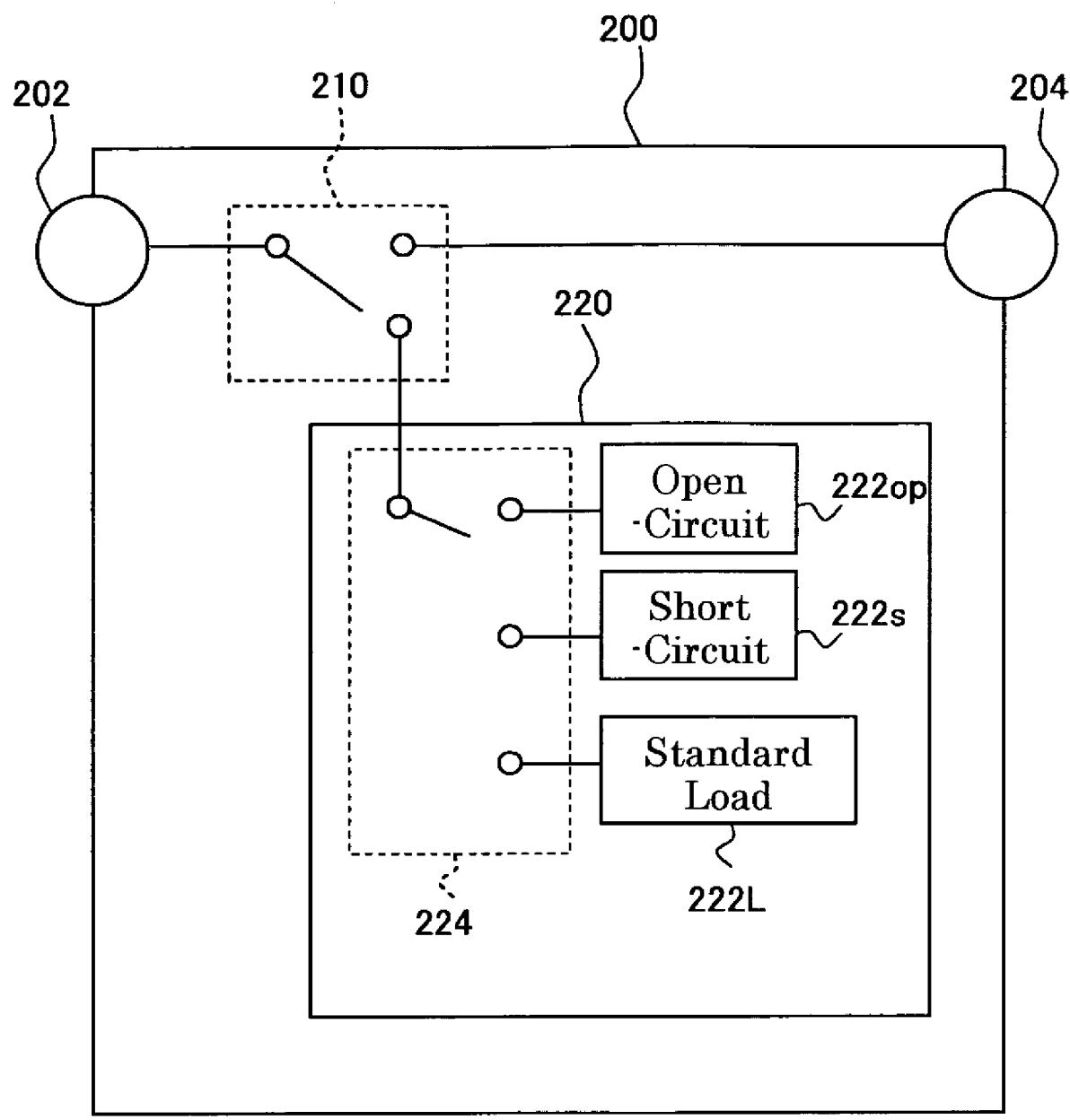
FIG. 4 is a diagram showing a configuration of a second state realization unit 220.

The second state realization unit 220 realizes a second state for the port 18 (28), namely for the output port or the reception port. A configuration of the second state realization unit 220 is shown in FIG. 4. The second state realization unit 220 includes an open-circuit calibration tool 222op, a short-circuit calibration tool 222s, a standard load calibration tool 222L, and a calibration tool connection unit 224.

The calibration tools are well-known calibration tools which realize three types of state: open-circuit, short-circuit, and load (standard load Z0) as described in Japanese Laid-Open Patent Publication (Kokai) No. H11-38054.

The open-circuit calibration tool 222op realizes the open-circuit state for the port 18 (28). The short-circuit calibration tool 222s realizes the short-circuit state for the port 18 (28). The standard load calibration tool 222L realizes the standard load state for the port 18 (28).

Namely, the second state implies the open-circuit state, the short-circuit state, and the standard load state for the port 18 or 28.

The calibration tool connection unit 224 connects any one of the open-circuit calibration tool 222op, the short-circuit calibration tool 222s, and the standard load calibration tool 222L to the second connection unit 210. The calibration tool connection unit 224 is a type of a switch.

The cable 300 connects the port 106 (108) of the first calibrator 100 and the port 202 of the second calibrator 200 with each other.

The DUT 400 includes the ports 402 and 404. The DUT 400 is a subject to be measured (device under test), and an object of the network analyzer 1 is to measure the true S parameters of the DUT 400.

A description will now be given of an operation of the first embodiment.

Figure 5:
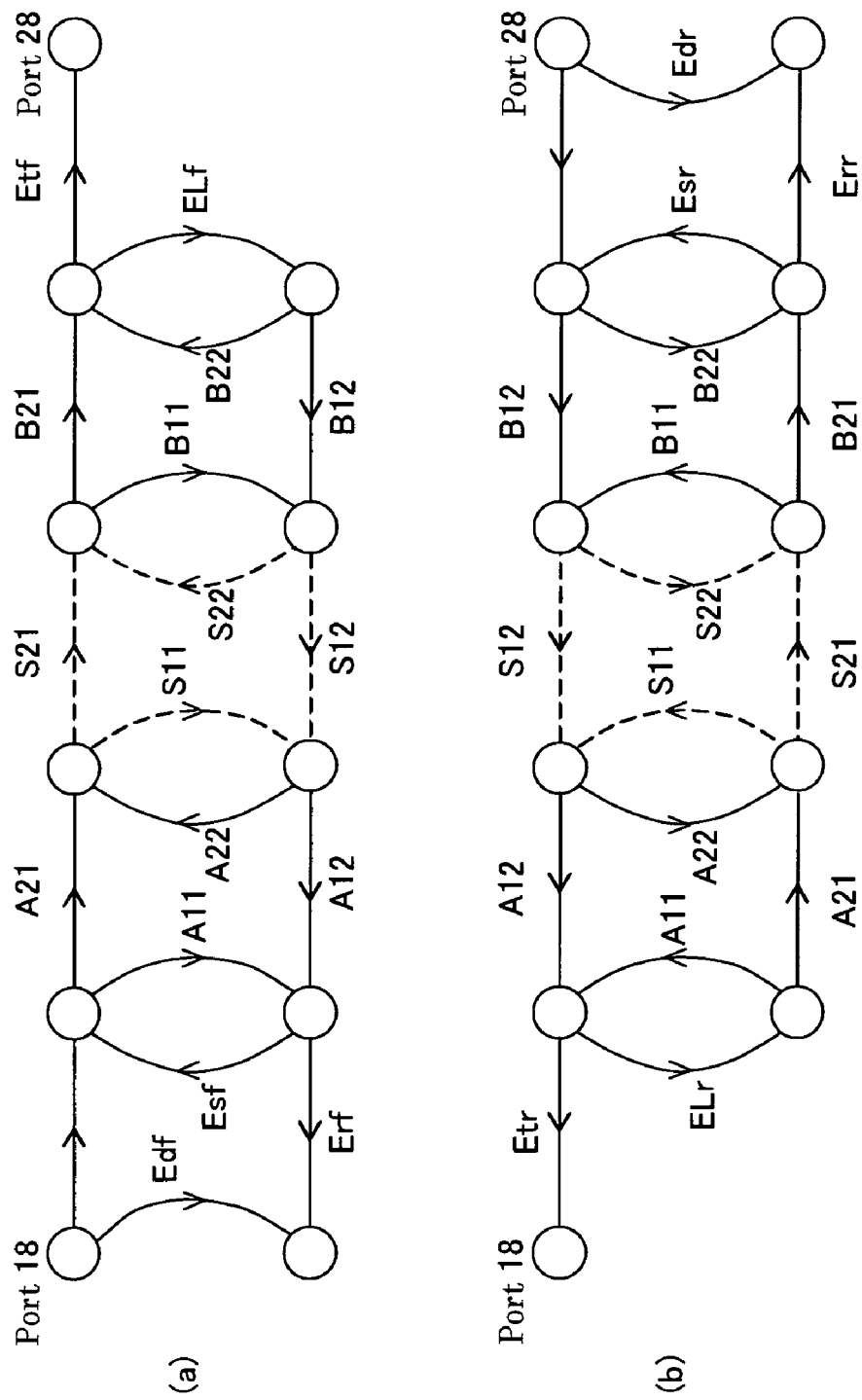

FIG. 5 includes signal flow graphs when the first connection unit 110a (110b) connects the port 18 (28) to the second calibrator 200, and the second connection units 210 connect the ports 202 to the DUT 400. It should be noted that FIG. 5(a) is a signal flow graph if the port 18 is the output port, and the port 28 is the reception port, and FIG. 5(b) is a signal flow graph if the port 18 is the reception port, and the port 28 is the output port.

The error factors of the measurement system include the first error factors and the second error factors. With reference to FIG. 5(a), the first error factors include Edf, Erf, Esf, Etf, and Elf. The second error factors include A11, A12, A21, A22, B11, B12, B21, and B22. It should be noted that a suffix f of the first error factors is an abbreviation of "forward", and implies the input signal is supplied to the DUT 400 from the port 18. Moreover, Ed denotes an error caused by the direction of a bridge, Er denotes an error caused by reflection tracking, Es denotes an error caused by source matching, Et denotes an error by transmission tracking, and EL denotes an error caused by load matching.

With reference to FIG. 5(b), the first error factors include Edr, Err, Esr, Etr, and ELr. The second error factors include A11, A12, A21, A22, B11, B12, B21, and B22. It should be noted that a suffix r of the first error factors is an abbreviation of "reverse", and implies the input signal is supplied to the DUT 400 from the port 28.

The results of the measurement of the S parameters of the DUT 400 through the ports 18 and 28 are not the precise S parameters (S11, S12, S21, and S22) of the DUT 400 due to the error factors of the measurement system. In order to address this problem, the precise S parameters of the DUT 400 are obtained by the measurement of the first error factors and the second error factors.

Figure 6:
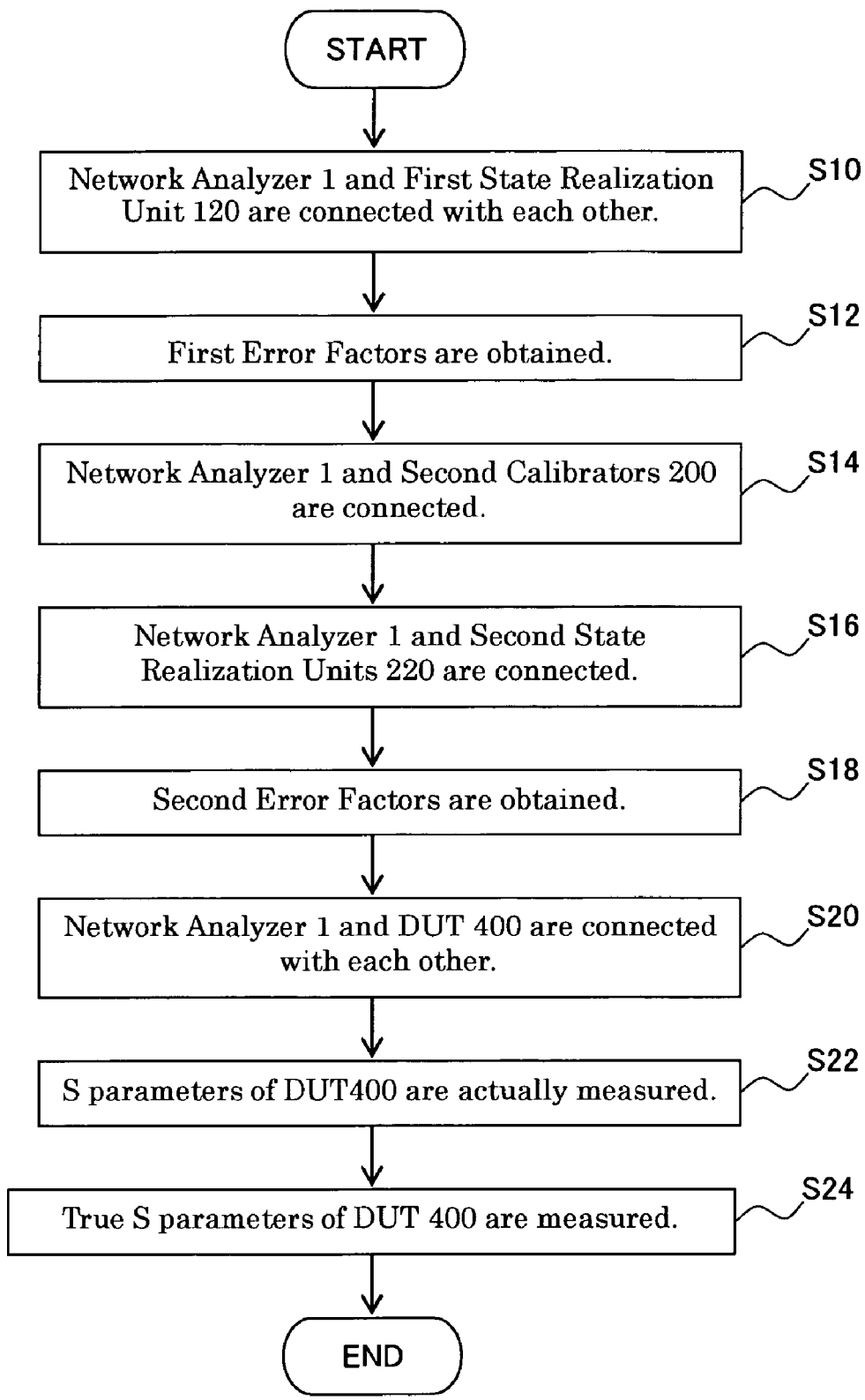
FIG. 6 is a flowchart showing an operation of the first embodiment.

FIG. 6 is a flowchart showing an operation of the first embodiment.

The network analyzer 1 and the first state realization unit 120 are first connected with each other (S10). Namely, the first connection unit 110a is caused to connect the port 18 to the first state realization unit 120, and the first connection unit 110b is caused to connect the port 28 to the first state realization unit 120.

Figure 7:
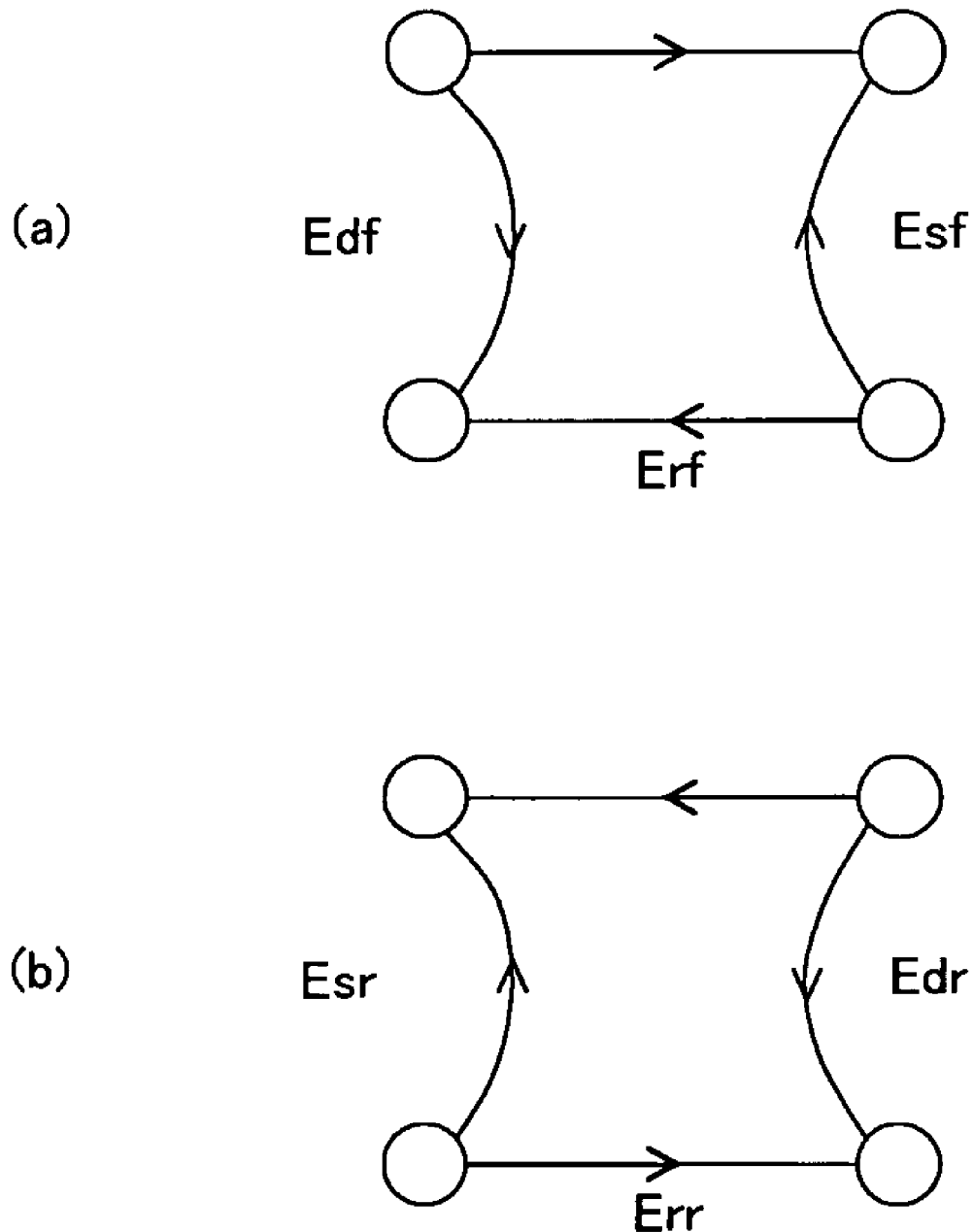
FIG. 7 shows signal flow graphs showing error factors Edf, Erf, and Esf (FIG. 7(a)) and error factors Edr, Err, and Esr (FIG. 7(b))
Figure 8:
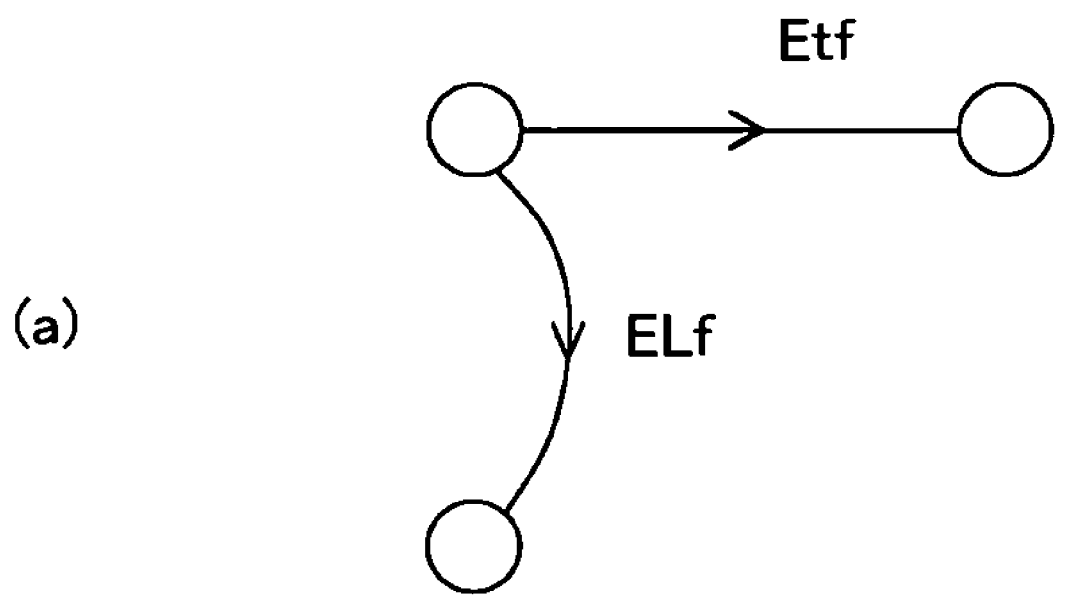
FIG. 8 shows signal flow graphs showing error factors Etf and ELf (FIG. 8(a)) and error factors Etr and ELr (FIG. 8(b))
Figure 8:
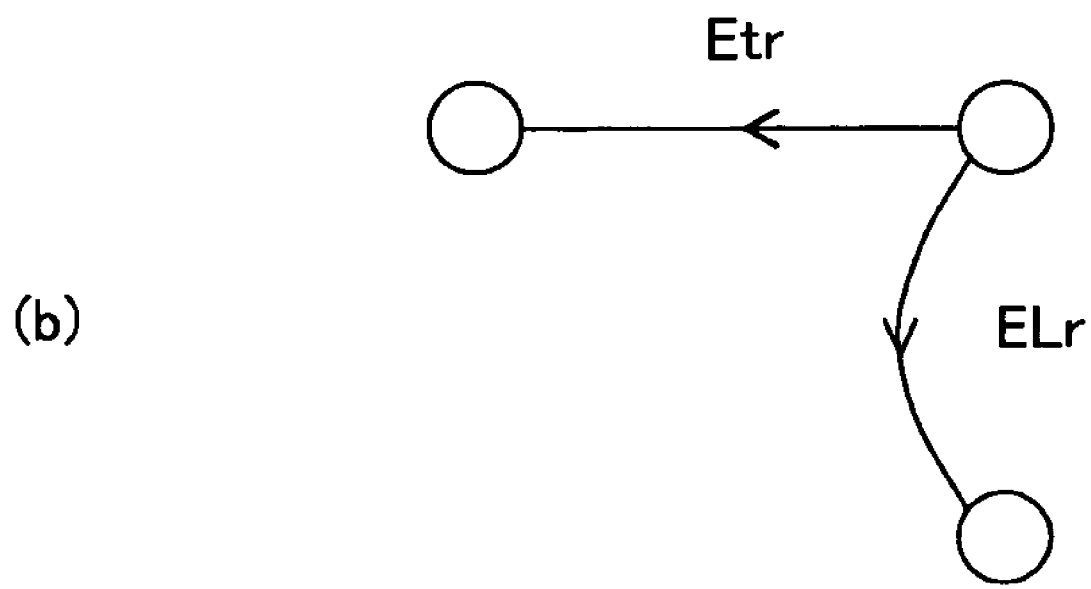

The first error factors are then obtained (S12). A signal is first output from the port 18. The port connection unit 126 connects the open-circuit calibration tool 122op, then the short-circuit calibration tool 122s, and then the standard load calibration tool 122L to the port 18 via the first connection unit 110a. On this occasion, the measurement system error factor acquisition unit 50 acquires the error factors Edf, Erf, and Esf shown in FIG. 7(a) based upon values measured by the receiver (RS) 16a and the receiver (TS) 16b, and writes them to the measurement system error factor recording unit 30. The port connection unit 126 then connects the short-circuit unit 124 to the port 18 via the first connection unit 110a, and, at the same time, the port connection unit 128 connects the short-circuit unit 124 to the port 28 via the first connection unit 110b. On this occasion, the measurement system error factor acquisition unit 50 acquires the error factors Etf and ELf shown in FIG. 8(a) based upon values measured by the receiver (RS) 16a, the receiver (TS) 16b, and the receiver (TR) 26a, and writes them to the measurement system error factor recording unit 30.

A signal is then output from the port 28. The port connection unit 128 connects the open-circuit calibration tool 123op, then the short-circuit calibration tool 123s, and then the standard load calibration tool 123L to the port 28 via the first connection unit 110b. On this occasion, the reception side measurement system error factor acquisition unit 70 acquires the error factors Edr, Err, and Esr shown in FIG. 7(b) based upon values measured by the receiver (TR) 26a and the receiver (RR) 26b, and writes them to the measurement system error factor recording unit 30. The port connection unit 126 then connects the short-circuit unit 124 to the port 18 via the first connection unit 110a, and, at the same time, the port connection unit 128 connects the short-circuit unit 124 to the port 28 via the first connection unit 110b. On this occasion, the reception side measurement system error factor acquisition unit 70 acquires the error factors Etr and ELr shown in FIG. 8(b) based upon values measured by the receiver (TR) 26a, the receiver (RR) 26b, and the receiver (TS) 16b, and writes them to the measurement system error factor recording unit 30.

The first error factors are acquired in this way.

The network analyzer 1 and the second calibrators 200 are then connected (S14). Namely, the first connection unit 110a is caused to connect the port 18 to the second calibrator 200, and the first connection unit 110b is caused to connect the port 28 to the second calibrator 200. The network analyzer 1 and the second state realization units 220 are further connected (S16). Namely, the second connection unit 210 is caused to connect the port 18 (28) to the second state realization unit 220 via the first connection unit 110a (110b).

Figure 9:
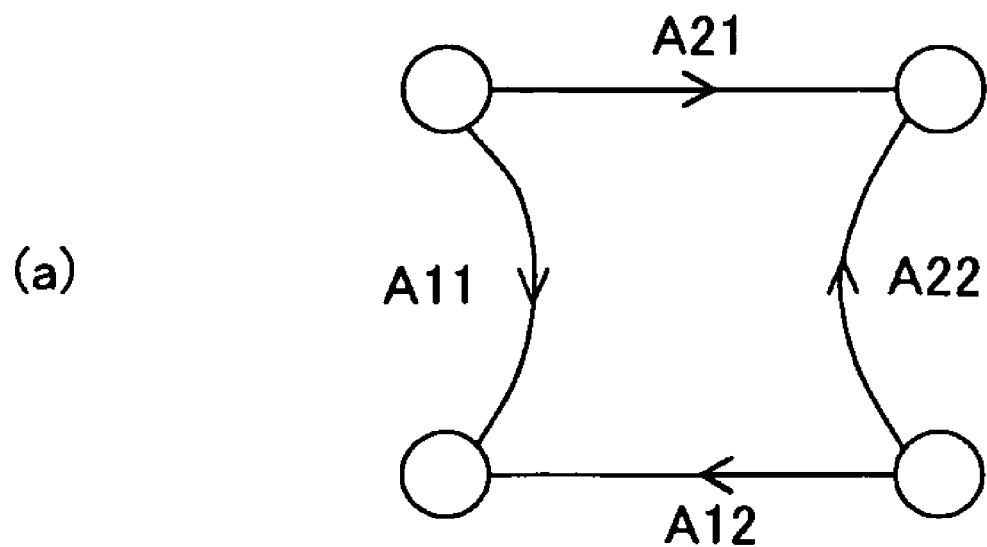
FIG. 9 shows signal flow graphs showing error factors A11, A12, A21 and A22 (FIG. 9(a)) and error factors B11, B12, B21 and B22 (FIG. 9(b))
Figure 9:
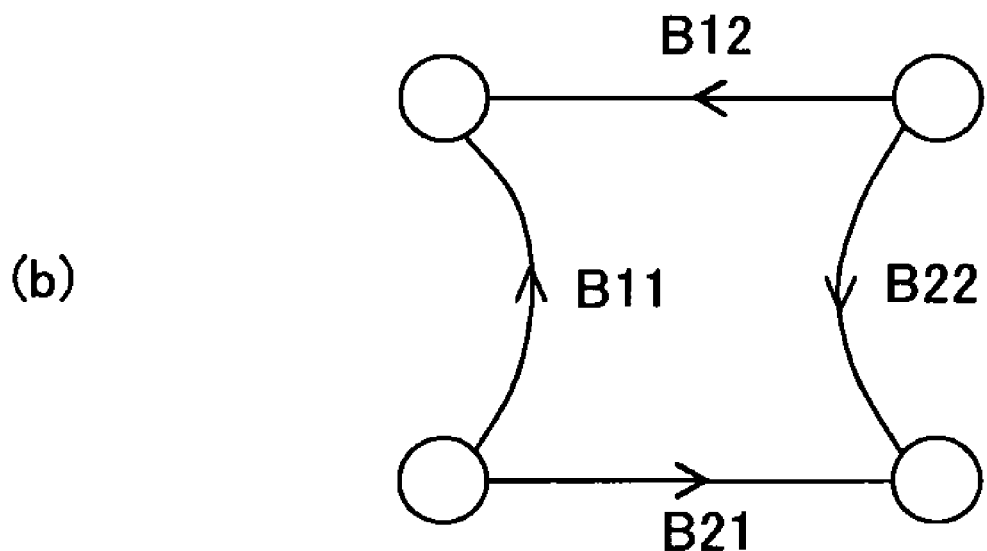

The second error factors are then obtained (S18). A signal is first output from the port 18. The calibration tool connection unit 224 connects the open-circuit calibration tool 222op, then the short-circuit calibration tool 222s, and then the standard load calibration tool 222L to the port 18 via the second connection unit 210. On this occasion, the measurement system error factor acquisition unit 50 acquires the error factors A11, A12, A21, and A22 shown in FIG. 9(a) based upon values measured by the receiver (RS) 16a and the receiver (TS) 16b, and writes them to the measurement system error factor recording unit 30.

A signal is then output from the port 28. The calibration tool connection unit 224 connects the open-circuit calibration tool 222op, then the short-circuit calibration tool 222s, and then the standard load calibration tool 222L to the port 28 via the second connection unit 210. On this occasion, the reception side measurement system error factor acquisition unit 70 acquires the error factors B11, B12, B21, and B22 shown in FIG. 9(b) based upon values measured by the receiver (TR) 26a and the receiver (RR) 26b, and writes them to the measurement system error factor recording unit 30.

The second error factors are acquired in this way.

The network analyzer 1 and the DUT 400 are then connected with each other (S20). Namely, the second connection unit 210 is caused to connect the port 18 (28) to the port 402 (404) of the DUT 400 via the first connection unit 110a (110b).

A signal is output from the port 18 or 28, and the circuit parameter measurement unit 40 actually measures the S parameters of the DUT 400 based upon values measured by the receiver (RS) 16a, the receiver (TS) 16b, the receiver (TR) 26a, and the receiver (RR) 26b (S22).

The actually measured values are influenced by the error factors of the measurement system. The circuit parameter measurement unit 40 reads out the measurement system error factors recorded in the measurement system error factor recording unit 30, removes the influences of the measurement system error factors from the actually measured S parameters of the DUT 400, and measures the true S parameters of the DUT 400 (S24).

According to the first embodiment, in stead of connecting and disconnecting calibration tools and the DUT 400 successively to the ports 18 and 28 of the network analyzer 1, the network analyzer 1 can be calibrated simply by operating the first connection units 110a and 110b, the second connection units 210, and the port connection units 126, 128, and 224.

Second Embodiment

A second embodiment is different from the first embodiment in that the numbers of the ports of the network analyzer 1 and the DUT 400 according to the first embodiment are respectively increased to four.

Figure 10:
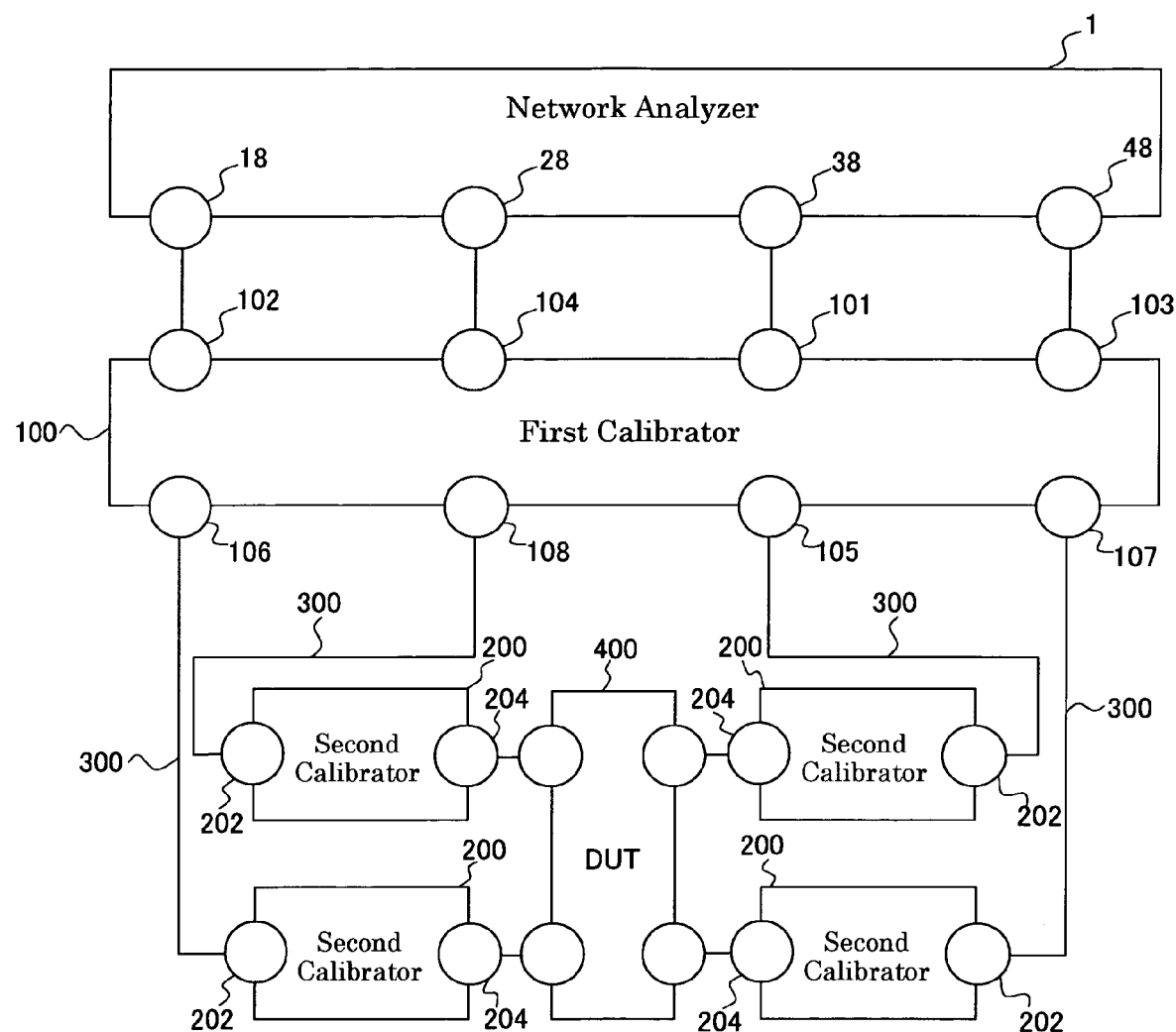
FIG. 10 is a diagram showing a configuration of a measurement system in which an error factor acquisition device according to a second embodiment of the present invention is used.

FIG. 10 is a diagram showing a configuration of a measurement system in which an error factor acquisition device according to a second embodiment of the present invention is used. The measurement system is provided with the network analyzer 1, the first calibrator 100, the second calibrators 200, the cables 300, and the DUT 400. The first calibrator 100 and the second calibrators 200 constitute the error factor acquisition device. In the following section, similar components are denoted by the same numerals as of the first embodiment, and will be explained in no more details.

The network analyzer 1 is provided with ports 18, 28, 38, and 48. The internal configuration thereof is approximately the same as that of the first embodiment. A signal output from a certain port can be received by any other ports. For example, a signal output from the port 18 can be received by any of the ports 28, 38, and 48. Moreover, any ports include what corresponds to the bridges 14a and 14b, and the receivers 16a and 16b.

Figure 11:
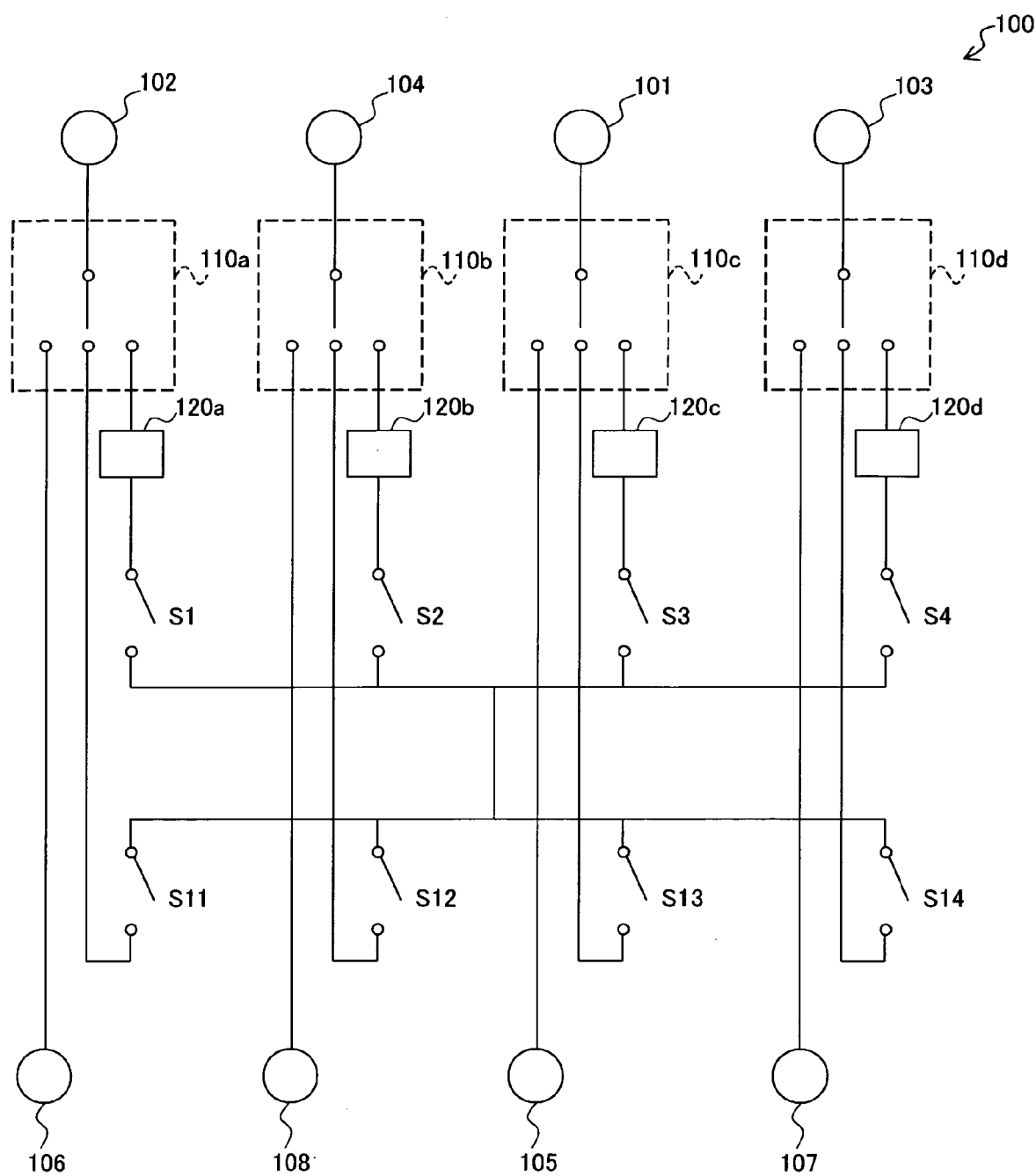
FIG. 11 is a diagram showing an internal configuration of a first calibrator 100 according to a second embodiment of the present invention.

An internal configuration of the first calibrator 100 is shown in FIG. 11. The first calibrator 100 includes ports 101, 102, 103, 104, 105, 106, 107, and 108, first connection units 110a, 110b, 110c, and 110d, the first state realization unit 120a, 120b, 120c, and 102d, and switches S1, S2, S3, S4, S11, S12, S13, and S14.

The port 102 is connected to the port 18. The port 104 is connected to the port 28. The port 101 is connected to the port 38. The port 103 is connected to the port 48. The ports 105, 106, 107, and 108 are respectively connected to the port 202 of the second calibrators 200.

The first connection unit 110a connects the port 102 to the port 106, the switch S11, or the first state realization unit 120a. The first connection unit 110b connects the port 104 to the port 108, the switch S12, or the first state realization unit 120b. The first connection unit 110c connects the port 101 to the port 105, the switch S13, or the first state realization unit 120c. The first connection unit 110d connects the port 103 to the port 107, the switch S14, or the first state realization unit 120d.

The first state realization unit 120a is connected to the first connection unit 110a and the switch S1. The first state realization unit 120b is connected to the first connection unit 110b and the switch S2. The first state realization unit 120c is connected to the first connection unit 110c and the switch S3. The first state realization unit 120d is connected to the first connection unit 110d and the switch S4. The internal configuration of the first state realization units 120a, 120b, 120c, and 120d are the same as that according to the first embodiment.

The switches S1, S2, S3, and S4 are connected to the switches S11, S12, S13, and S14. Any one of the switches S1, S2, S3, and S4 is turned on. If the switch S1 is turned on, any one of the switches S12, S13, and S14 is turned on. If the switch S2 is turned on, any one of the switches S11, S13, and S14 is turned on. If the switch S3 is turned on, any one of the switches S11, S12, and S14 is turned on. If the switch S4 is turned on, any one of the switches S11, S12, and S13 is turned on.

The second calibrators 200, the cables 300, and the DUT 400 are the same as those of the first embodiment. It should be noted that the DUT 400 includes the four ports.

A description will now be given of an operation of the second embodiment. The operation of the second embodiment is almost the same as that of the first embodiment, and a description will be given with reference to the flowchart shown in FIG. 6.

The network analyzer 1 and the first state realization units 120a, 120b, 120c, and 120d are first connected (S10). Namely, the first connection unit 110a is caused to connect the port 18 to the first state realization unit 120a, the first connection unit 110b is caused to connect the port 28 to the first state realization unit 120b, the first connection unit 110c is caused to connect the port 38 to the first state realization unit 120c, and the first connection unit 110d is caused to connect the port 48 to the first state realization unit 120d.

The first error factors are then obtained (S12). This is approximately the same as that of the first embodiment. Namely, signals are respectively output from the ports 18, 28, 38, and 48. The open-circuit calibration tool, the short-circuit calibration tool, and the standard load calibration tool of the first state realization units 120a, 120b, 120c, and 120d are successively connected to the ports 18, 28, 38, and 48. Moreover, the port 18 is connected to the port 28 via the first connection unit 110a, the first state realization unit 120a, the switch S1, the switch S12, and the first connection unit 110b. Similarly, the port 18 is connected to the ports 38 and 48, the port 28 is connected to the ports 38 and 48, and the port 38 is connected to the port 48. The first error factors are then acquired based upon values measured by the receivers on the respective occasions.

The network analyzer 1 and the second calibrators 200 are then connected (S14). Namely, the first connection unit 110a is caused to connect the port 18 to the second calibrator 200, the first connection unit 110b is caused to connect the port 28 to the second calibrator 200, the first connection unit 110c is caused to connect the port 38 to the second calibrator 200, and the first connection unit 110d is caused to connect the port 48 to the second calibrator 200.

The network analyzer 1 and the second state realization units 220 are further connected (S16). Namely, the second connection units 210 are respectively caused to connect the port 18, 28, 38, and 48 to the second state realization units 220 via the first connection units 110a, 110b, 110c, and 110d.

The second error factors are then obtained (S18). This is approximately the same as that of the first embodiment. Namely, signals are respectively output from the ports 18, 28, 38, and 48. The open-circuit calibration tool, the short-circuit calibration tool, and the standard load calibration tool of the second state realization units 220 are then successively connected to the ports 18, 28, 38, and 48. The second error factors are then acquired based upon values measured by the receivers on the respective occasions.

The network analyzer 1 and the DUT 400 are then connected (S20). Namely, the second connection units 210 are respectively caused to connect the port 18, 28, 38, and 48 to the respective ports of the DUT 400 via the first connection units 110a, 110b, 110c, and 110d.

On this occasion, a signal is output from any of the ports 18, 28, 38, and 48, and the circuit parameter measuring unit 40 actually measures S parameters of the DUT400 (S22) based upon values measured by the receivers.

The actually measured values are influenced by the error factors of the measurement system. The circuit parameter measurement unit 40 reads out the measurement system error factors recorded in the measurement system error factor recording unit 30, removes the influences of the measurement system error factors from the actually measured S parameters of the DUT 400, and measures true S parameters of the DUT 400 (S24).

According to the second embodiment, even if the numbers of the network analyzer 1 and the DUT 400 are respectively increased to four, the same effects are provided as the first embodiment.

Third Embodiment

According to a third embodiment, the number (nine) of the ports of the DUT 400 is larger than the number (four) of the ports of the network analyzer 1, and the third embodiment is different from the second embodiment in that the error factor acquisition device is further provided with a nine-port test set (branch connection means) 500.

Figure 12:
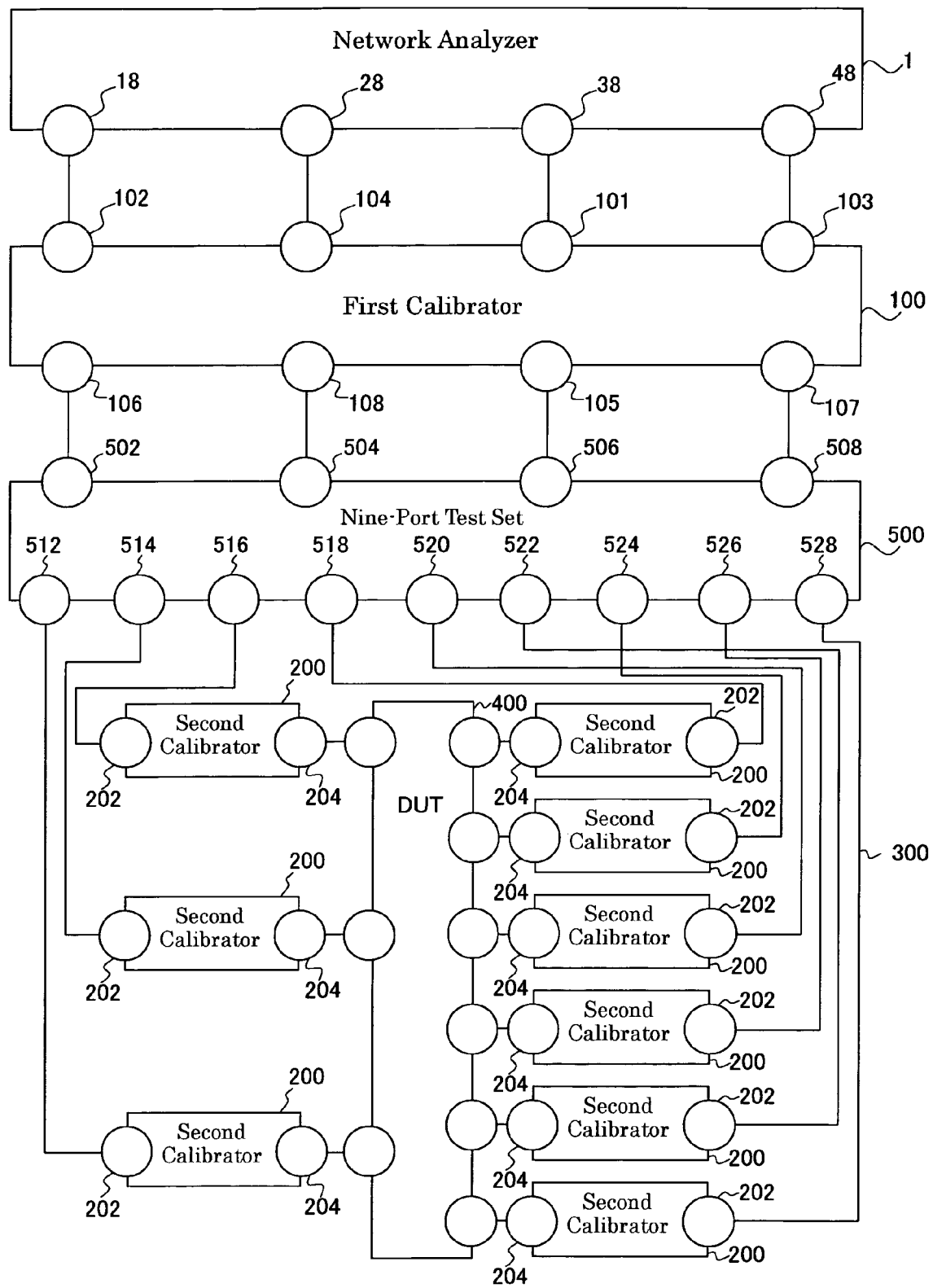
FIG. 12 is a diagram showing a configuration of a measurement system in which an error factor acquisition device according to a third embodiment of the present invention is used.

FIG. 12 is a diagram showing a configuration of a measurement system in which the error factor acquisition device according to the third embodiment of the present invention is used. The measurement system is provided with a network analyzer 1, the first calibrator 100, the second calibrators 200, the cables 300, the DUT 400, and the nine-port test set 500. The first calibrator 100 and the second calibrators 200 constitute the error factor acquisition device. In the following section, similar components are denoted by the same numerals as of the second embodiment, and will be explained in no more details.

The network analyzer 1, the first calibrator 100, the second calibrators 200, the cables 300, and the DUT 400 are the same as those of the second embodiment.

The nine-port test set (branch connection means) 500 includes ports 502, 504, 506, 508, 512, 514, 516, 518, 520, 522, 524, 526, and 528. The ports 502, 504, 506, and 508 are respectively connected to the ports 106, 108, 105, and 107. The ports 512, 514, 516, 518, 520, 522, 524, 526, and 528 are respectively connected to the ports 202.

Figure 13:
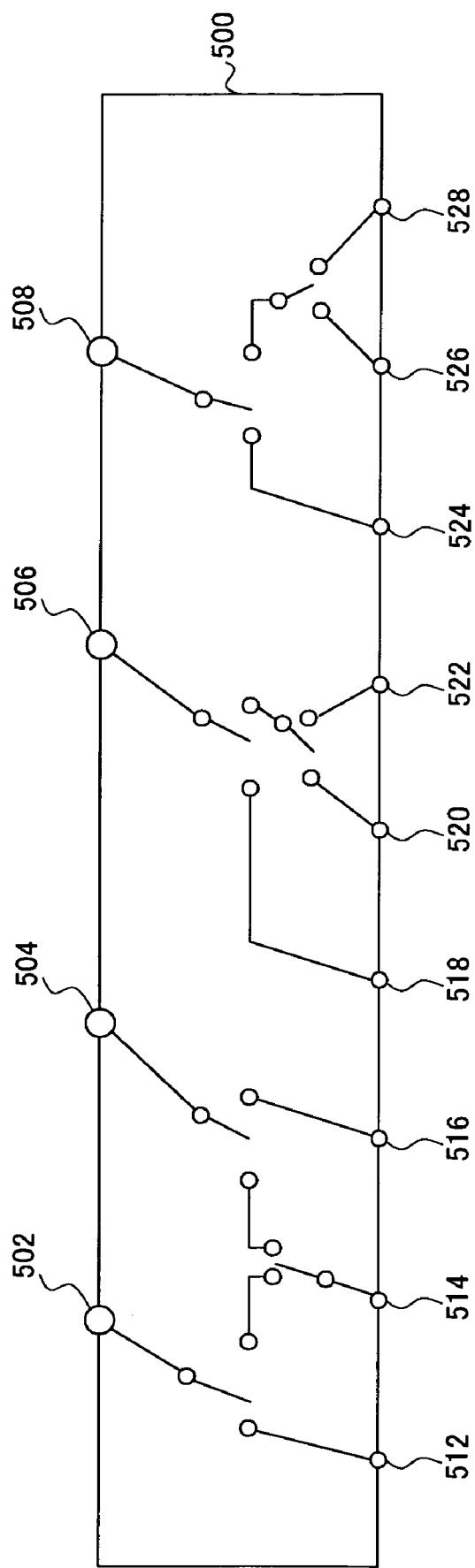
FIG. 13 is a diagram showing an internal configuration of the nine-port test set 500.

An internal configuration of the nine-port test set 500 is shown in FIG. 13. The port 502 is to be connected to the port 512 or 514. The port 504 is to be connected to the port 514 or 516. It should be noted that if the port 502 is connected to the port 514, the port 514 is to be connected to the port 516. The port 506 is to be connected to the port 518, 520, or 522. The port 508 is to be connected to the port 524, 526, or 528. In this way, the ports 106, 108, 105, and 107 of the first calibrator 100 are respectively connected to any of the ports 202 of the second calibrators 200.

An operation of the third embodiment is approximately the same as that of the second embodiment. However, the ports 18, 28, 38, 48 of the network analyzer 1 are connected to any one of the second calibrators 200 by means of the nine-port test set 500.

According to the third embodiment, even if the number (nine) of the ports of the DUT 400 is larger than the number (four) of the ports of the network analyzer 1, there are provided the same effects as those of the first embodiment. It should be noted that even if the number of the ports of the DUT 400 increases further, the same effects can be provided by using a test head similar to the nine-port test set 500.

Fourth Embodiment

A fourth embodiment uses a wafer 410 and wafer probes 420 in place of the DUT 400 according to the first embodiment.

Figure 14:
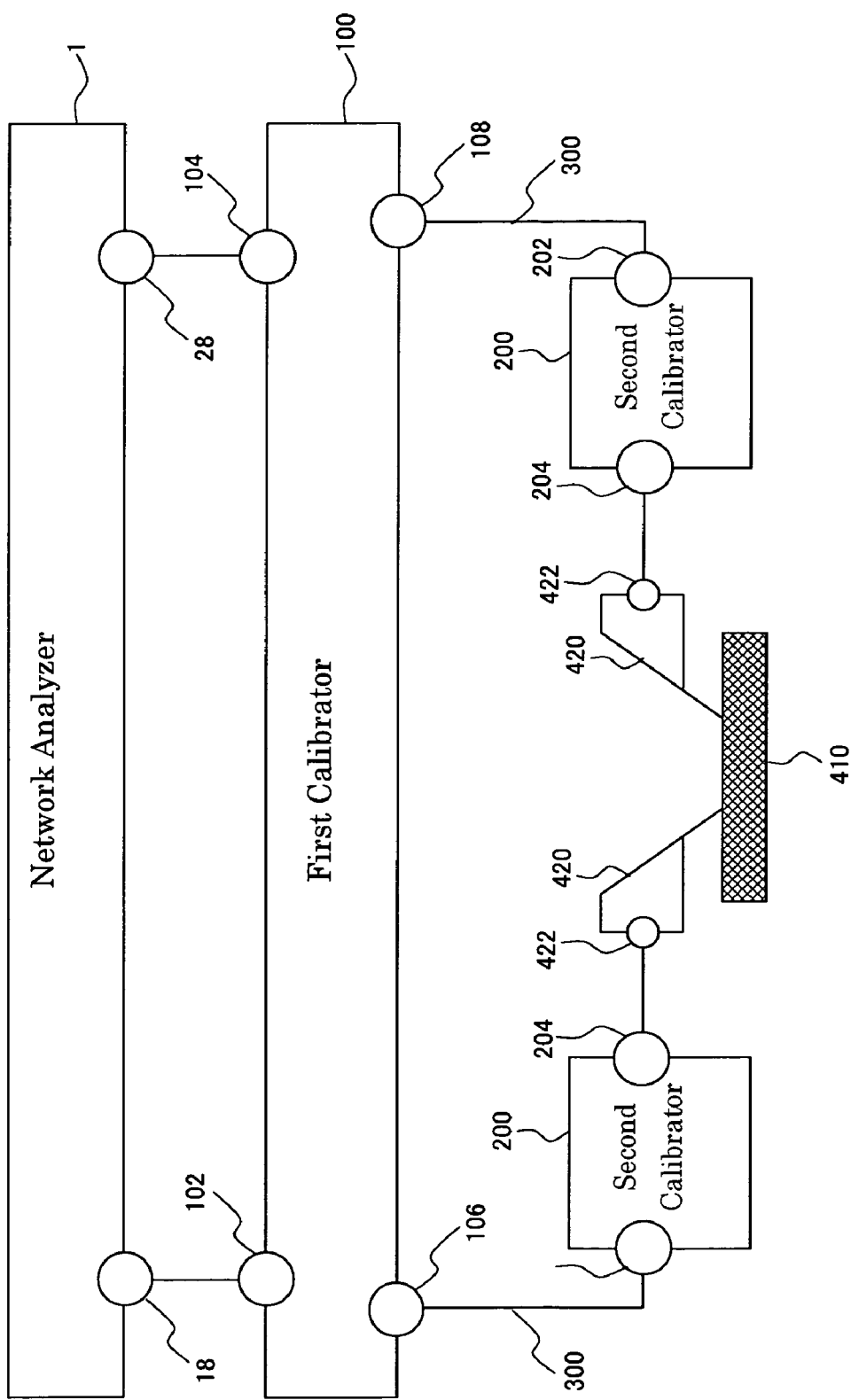
FIG. 14 is a diagram showing a configuration of a measurement system in which an error factor acquisition device according to a fourth embodiment of the present invention is used.

FIG. 14 is a diagram showing a configuration of a measurement system in which an error factor acquisition device according to the fourth embodiment of the present invention is used. The measurement system is provided with the network analyzer 1, the first calibrator 100, the second calibrators 200, the cables 300, the wafer 410, and the wafer probes 420. The first calibrator 100 and the second calibrators 200 constitute the error factor acquisition device. It should be noted that the network analyzer 1, the first calibrator 100, the second calibrators 200, and the cables 300 are the same as those of the first embodiment.

The wafer 410 is a subject to be measured by the network analyzer 1. The wafer probes 420 are to be brought into contact with the wafer 410, and are respectively connected to the second calibrators 200 via the ports 422.

Figure 15:
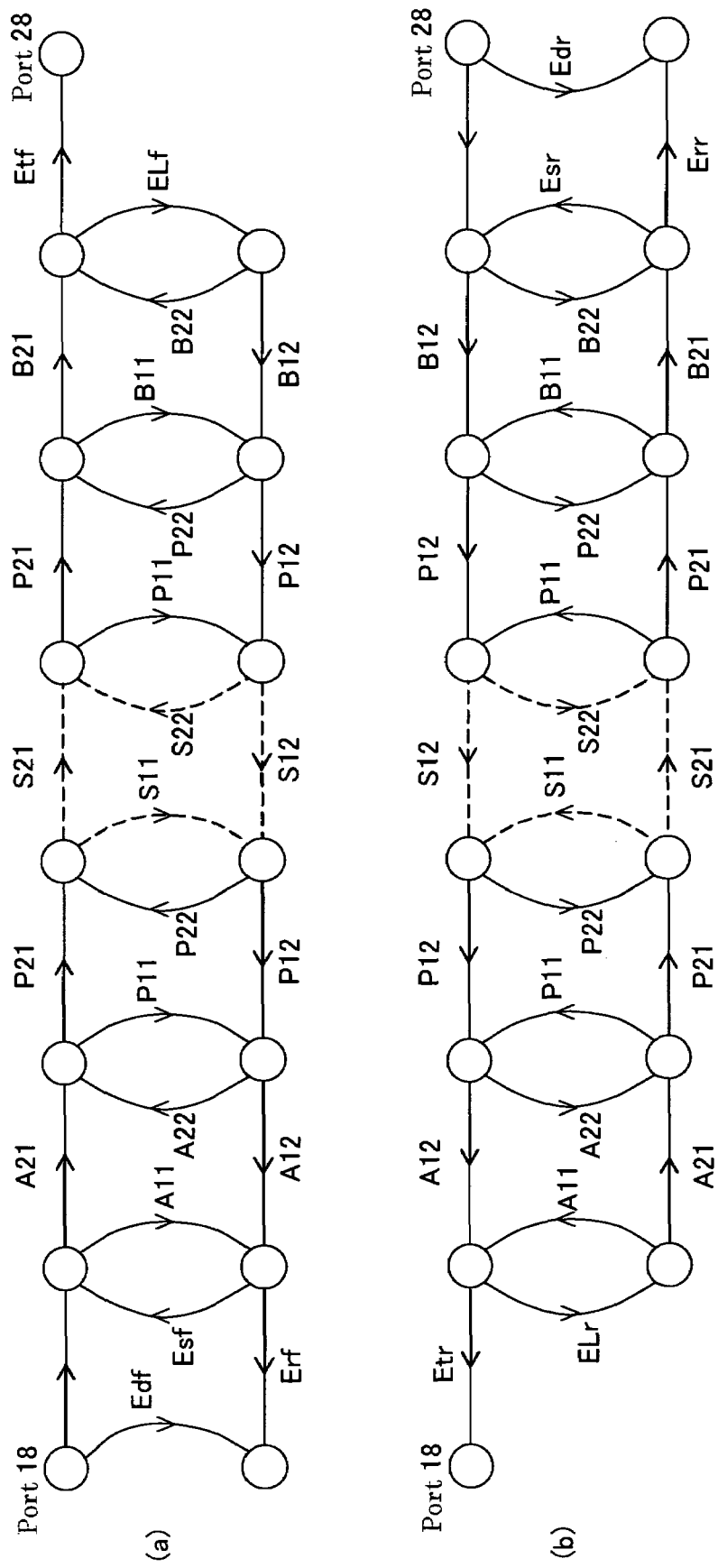
Figure 16:
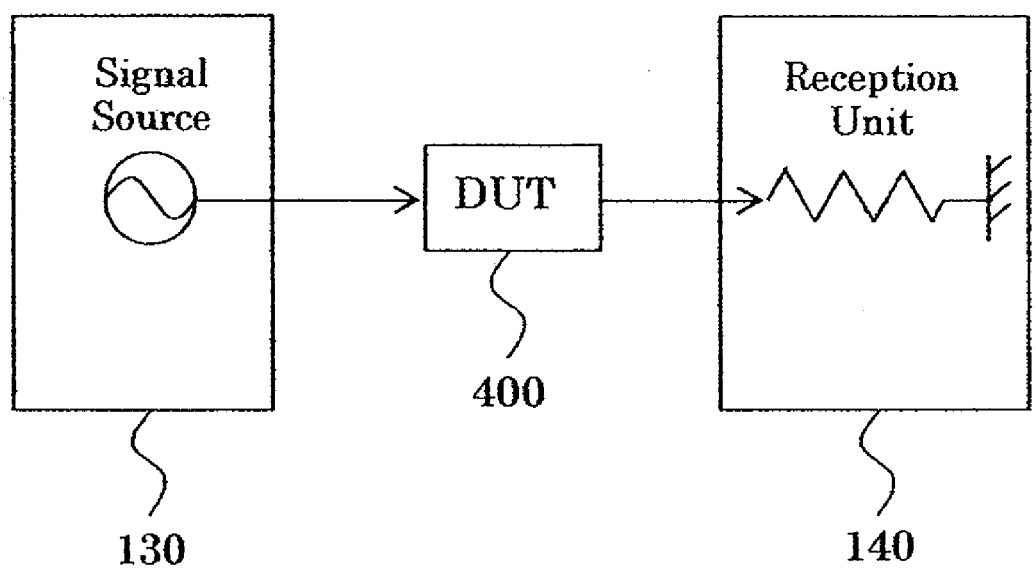
FIG. 16 is a diagram for explaining a measurement method of the circuit parameters of a device under test (DUT) according to the prior art.
Figure 17:
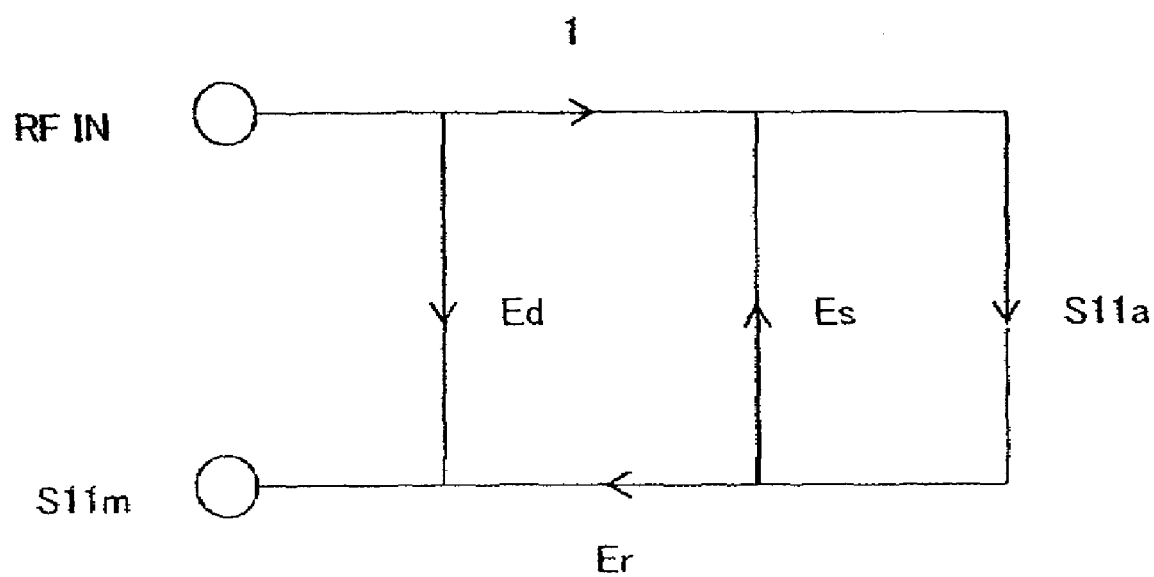
FIG. 17 is a signal flow graph relating to a signal source 130 according to the prior art.

FIG. 15 includes signal flow graphs when the first connection unit 110a (110b) connects the port 18 (28) to the second calibrators 200, and the second connection units 210 connect the ports 202 to the wafer probes 420. It should be noted that FIG. 15(a) is a signal flow graph if the port 18 is the output port, and the port 28 is the reception port, and FIG. 15(b) is a signal flow graph if the port 18 is the reception port, and the port 28 is the output port.

Although the signal flow graphs shown in FIG. 15 are approximately the same as those of the first embodiment (refer to FIG. 5), they are different in that error factors P11, P12, P21, and P22 of the wafer probes 420 are further added. The wafer probes 420 are finely produced, and have small individual differences in terms of electric characteristics. Therefore, if the error factors P11, P12, P21, and P22 of the wafer probes 420 are recorded in the measurement system error factor recording unit 30 in advance, it is possible to remove influences of the error factors P11, P12, P21, and P22 from actually measured S parameters of the DUT 400, thereby measuring true S parameters of the DUT 400.

An operation of the fourth embodiment is approximately the same as that of the first embodiment (refer to FIG. 6). It should be noted that the measurement system error factors recorded in the measurement system error factor recording unit 30 include the error factors P11, P12, P21, and P22 of the wafer probe 420. As a result, the circuit parameter measurement unit 40 reads out the measurement system error factors (the first error factors, the second error factors, and the error factors P11, P12, P21, and P22) recorded in the measurement system error factor recording unit 30, removes the influences of the measurement system error factors from actually measured S parameters of the DUT 400, thereby measuring true S parameters of the DUT 400 (S24).

Moreover, the above-described embodiment may be realized in the following manner. Namely, a computer is provided with a CPU, a hard disk, and a media (such as a floppy disk (registered trade mark) and a CD-ROM) reader, and the media reader is caused to read a medium recording a program realizing the above-described respective parts (such as the measurement system error factor recording unit 30, the circuit parameter measurement unit 40, the measurement system error factor acquisition unit 50, the reception side measurement system error factor recording unit 70), thereby installing the program on the hard disk. This method may also realize the above-described functions.

The invention claimed is:

1. An error factor acquisition device that acquires an error factor between a device under test and a network analyzer having a signal output unit, an output port that outputs a signal supplied from the signal output unit, and a reception port that receives the signal, said error factor acquisition device comprising:

a first calibrator that includes a first state realization unit that realizes a first state for the output port and the reception port of the network analyzer, and is connected to the output port and the reception port; and a second calibrator that includes a second state realization unit that realizes a second state for the output port and the reception port of the network analyzer, and is connected to said first calibrator and the device under test, wherein:

said first calibrator includes a first connection unit that connects the output port and the reception port either to said first state realization unit or said second calibrator; and said second calibrator includes a second connection unit that connects the output port and the reception port either to said second state realization unit or the device under test.

2. The error factor acquisition device according to claim 1, wherein said first state realization unit includes:

an open-circuit calibration tool that realizes an open-circuit state;

a short-circuit calibration tool that realizes a short-circuit state;

a standard load calibration tool that realizes a standard load state;

a short-circuiting unit that short-circuits the output port and the reception port;

an output port connection unit that connects any one of said open-circuit calibration tool, said short-circuit calibration tool, said standard load calibration tool, and said short-circuiting unit to the output port; and a reception port connection unit that connects any one of said open-circuit calibration tool, said short-circuit calibration tool, said standard load calibration tool, and said short-circuiting unit to the reception port.

3. The error factor acquisition device according to claim 2, wherein the number of ports of the device under test is larger than the number of ports of the network analyzer, comprising a branch connector that connects a port of said first calibrator to any one of ports of said second calibrator.

4. The error factor acquisition device according to claim 2, wherein said device under test includes a wafer and a wafer probe that is in contact with the wafer, and is connected to said second calibrator.

5. The error factor acquisition device according to claim 1, wherein said second state realization unit includes:

an open-circuit calibration tool that realizes an open-circuit state;

a short-circuit calibration tool that realizes a short-circuit state;

a standard load calibration tool that realizes a standard load state; and a calibration tool connection unit that connects any one of said open-circuit calibration tool, said short-circuit calibration tool, and said standard load calibration tool to the network analyzer.

6. The error factor acquisition device according to claim 5, wherein the number of ports of the device under test is larger than the number of ports of the network analyzer, comprising a branch connector that connects a port of said first calibrator to any one of ports of said second calibrator.

7. The error factor acquisition device according to claim 5, wherein said device under test includes a wafer and a wafer probe that is in contact with the wafer, and is connected to said second calibrator.

8. The error factor acquisition device according to claim 1, wherein the number of ports of the device under test is larger than the number of ports of the network analyzer, comprising a branch connector that connects a port of said first calibrator to any one of ports of said second calibrator.

9. The error factor acquisition device according to claim 8, wherein said device under test includes a wafer and a wafer probe that is in contact with the wafer, and is connected to said second calibrator.

10. The error factor acquisition device according to claim 1, wherein said device under test includes a wafer and a wafer probe that is in contact with the wafer, and is connected to said second calibrator.

11. An error factor acquisition method for acquiring an error factor by using an error factor acquisition device that acquires an error factor between a device under test and a network analyzer having a signal output unit, an output port that outputs a signal supplied from the signal output unit, and a reception port that receives the signal, including: (i) a first calibrator that includes a first state realization unit that realizes a first state for the output port and the reception port of the network analyzer, and is connected to the output port and the reception port; and (ii) a second calibrator that includes a second state realization unit that realizes a second state for the output port and the reception port of the network analyzer, and is connected to said first calibrator and the device under test, wherein: (iii) said first calibrator includes a first connection unit that connects the output port and the reception port either to said first state realization unit or said second calibrator; and (iv) said second calibrator includes a second connection unit that connects the output port and the reception port either to said second state realization unit or the device under test, said error factor acquisition method comprising:

acquiring a first error factor between the network analyzer and the first calibrator based upon predetermined parameters measured for a signal before being output from the output port, a signal reflected back from the first state realization unit to the output port, and a signal received by the reception port upon the network analyzer being connected to said first state realization unit; and acquiring a second error factor between the device under test and the first calibrator based upon a signal before being output from the output port, and a signal reflected back from the second state realization unit to the output port upon the network analyzer being connected to the second state realization unit.

12. An error factor acquisition method for acquiring an error factor by using an error factor acquisition device that acquires an error factor between a device under test and a network analyzer having a signal output unit, an output port that outputs a signal supplied from the signal output unit, and a reception port that receives the signal, including: (i) a first calibrator that includes a first state realization unit that realizes a first state for the output port and the reception port of the network analyzer, and is connected to the output port and the reception port; and (ii) a second calibrator that includes a second state realization unit that realizes a second state for the output port and the reception port of the network analyzer, and is connected to said first calibrator and the device under test, wherein: (iii) said first calibrator includes a first connection unit that connects the output port and the reception port either to said first state realization unit or said second calibrator; (iv) said second calibrator includes a second connection unit that connects the output port and the reception port either to said second state realization unit or the device under test; and (v) said device under test includes a wafer and a wafer probe that is in contact with the wafer, and is connected to said second calibrator, said error factor acquisition method comprising:

acquiring a first error factor between the network analyzer and the first calibrator based upon predetermined parameters measured for a signal before being output from the output port, a signal reflected back from the first state realization unit to the output port, and a signal received by the reception port upon the network analyzer being connected to said first state realization unit;

acquiring a second error factor between the device under test and the first calibrator based upon a signal before being output from the output port, and a signal reflected back from the second state realization unit to the output port upon the network analyzer being connected to the second state realization unit; and measuring a predetermined parameter of the wafer based upon the first error factor, the second error factor, and an error factor of the wafer probe.

13. A program of instructions for execution by the computer to perform an error factor acquisition process for acquiring an error factor by using an error factor acquisition device that acquires an error factor between a device under test and a network analyzer having a signal output unit, an output port that outputs a signal supplied from the signal output unit, and a reception port that receives the signal, including: (i) a first calibrator that includes a first state realization unit that realizes a first state for the output port and the reception port of the network analyzer, and is connected to the output port and the reception port; and (ii) a second calibrator that includes a second state realization unit that realizes a second state for the output port and the reception port of the network analyzer, and is connected to said first calibrator and the device under test, wherein: (iii) said first calibrator includes a first connection unit that connects the output port and the reception port either to said first state realization unit or said second calibrator; and (iv) said second calibrator includes a second connection unit that connects the output port and the reception port either to said second state realization unit or the device under test, said error factor acquisition process comprising:

acquiring a first error factor between the network analyzer and the first calibrator based upon predetermined parameters measured for a signal before being output from the output port, a signal reflected back from the first state realization unit to the output port, and a signal received by the reception port upon the network analyzer being connected to said first state realization unit; and acquiring a second error factor between the device under test and the first calibrator based upon a signal before being output from the output port, and a signal reflected back from the second state realization unit to the output port upon the network analyzer being connected to the second state realization unit.

14. A program of instructions for execution by the computer to perform an error factor acquisition process for acquiring an error factor by using an error factor acquisition device that acquires an error factor between a device under test and a network analyzer having a signal output unit, an output port that outputs a signal supplied from the signal output unit, and a reception port that receives the signal, including: (i) a first calibrator that includes a first state realization unit that realizes a first state for the output port and the reception port of the network analyzer, and is connected to the output port and the reception port; and (ii) a second calibrator that includes a second state realization unit that realizes a second state for the output port and the reception port of the network analyzer, and is connected to said first calibrator and the device under test, wherein: (iii) said first calibrator includes a first connection unit that connects the output port and the reception port either to said first state realization unit or said second calibrator; (iv) said second calibrator includes a second connection unit that connects the output port and the reception port either to said second state realization unit or the device under test; and (v) said device under test includes a wafer and a wafer probe that is in contact with the wafer, and is connected to said second calibrator, said error factor acquisition process comprising:

acquiring a first error factor between the network analyzer and the first calibrator based upon predetermined parameters measured for a signal before being output from the output port, a signal reflected back from the first state realization unit to the output port, and a signal received by the reception port upon the network analyzer being connected to said first state realization unit;

acquiring a second error factor between the device under test and the first calibrator based upon a signal before being output from the output port, and a signal reflected back from the second state realization unit to the output port upon the network analyzer being connected to the second state realization unit; and measuring a predetermined parameter of the wafer based upon the first error factor, the second error factor, and an error factor of the wafer probe.

15. A computer-readable medium having a program of instructions for execution by the computer to perform an error factor acquisition process for acquiring an error factor by using an error factor acquisition device that acquires an error factor between a device under test and a network analyzer having a signal output unit, an output port that outputs a signal supplied from the signal output unit, and a reception port that receives the signal, including: (i) a first calibrator that includes a first state realization unit that realizes a first state for the output port and the reception port of the network analyzer, and is connected to the output port and the reception port; and (ii) a second calibrator that includes a second state realization unit that realizes a second state for the output port and the reception port of the network analyzer, and is connected to said first calibrator and the device under test, wherein: (iii) said first calibrator includes a first connection unit that connects the output port and the reception port either to said first state realization unit or said second calibrator; and (iv) said second calibrator includes a second connection unit that connects the output port and the reception port either to said second state realization unit or the device under test, said error factor acquisition process comprising:

acquiring a first error factor between the network analyzer and the first calibrator based upon predetermined parameters measured for a signal before being output from the output port, a signal reflected back from the first state realization unit to the output port, and a signal received by the reception port upon the network analyzer being connected to said first state realization unit; and acquiring a second error factor between the device under test and the first calibrator based upon a signal before being output from the output port, and a signal reflected back from the second state realization unit to the output port upon the network analyzer being connected to the second state realization unit.

16. A computer-readable medium having a program of instructions for execution by the computer to perform an error factor acquisition process for acquiring an error factor by using an error factor acquisition device that acquires an error factor between a device under test and a network analyzer having a signal output unit, an output port that outputs a signal supplied from the signal output unit, and a reception port that receives the signal, including: (i) a first calibrator that includes a first state realization unit that realizes a first state for the output port and the reception port of the network analyzer, and is connected to the output port and the reception port; and (ii) a second calibrator that includes a second state realization unit that realizes a second state for the output port and the reception port of the network analyzer, and is connected to said first calibrator and the device under test, wherein: (iii) said first calibrator includes a first connection unit that connects the output port and the reception port either to said first state realization unit or said second calibrator; (iv) said second calibrator includes a second connection unit that connects the output port and the reception port either to said second state realization unit or the device under test; and (v) said device under test includes a wafer and a wafer probe that is in contact with the wafer, and is connected to said second calibrator, said error factor acquisition process comprising:

acquiring a first error factor between the network analyzer and the first calibrator based upon predetermined parameters measured for a signal before being output from the output port, a signal reflected back from the first state realization unit to the output port, and a signal received by the reception port upon the network analyzer being connected to said first state realization unit;

acquiring a second error factor between the device under test and the first calibrator based upon a signal before being output from the output port, and a signal reflected back from the second state realization unit to the output port upon the network analyzer being connected to the second state realization unit; and measuring a predetermined parameter of the wafer based upon the first error factor, the second error factor, and an error factor of the wafer probe.

* * * * *